US012805338B2

(12) United States Patent
Park et al.

(10) Patent No.: US 12,805,338 B2
(45) Date of Patent: Nov. 17, 2026

(54) SEMICONDUCTOR DEVICE FABRICATING METHOD

(71) Applicant: SAMSUNG ELECTRONICS CO., LTD., Suwon-si (KR)

(72) Inventors: Ji Soo Park, Suwon-si (KR); Jung Han Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 362 days.

(21) Appl. No.: 18/535,167

(22) Filed: Dec. 11, 2023

(65) Prior Publication Data

US 2024/0371784 A1 Nov. 7, 2024

(30) Foreign Application Priority Data

May 3, 2023 (KR) ........................ 10-2023-0057683

(51) Int. Cl.
*H10W 46/00* (2026.01)
*H10W 20/00* (2026.01)

(52) U.S. Cl.
CPC ......... *H10W 46/00* (2026.01); *H10W 20/056* (2026.01); *H10W 20/076* (2026.01); *H10W 20/089* (2026.01); *H10W 46/301* (2026.01)

(58) Field of Classification Search
CPC . H10W 46/00; H10W 20/056; H10W 20/076; H10W 20/089; H10W 46/301; H10W 20/069; H10W 20/40; H10D 30/6757; H10D 84/038; H10D 84/0186; H10D 62/121; H10D 84/017; H10D 84/853
USPC ........................................................... 438/637
See application file for complete search history.

(56) References Cited

U.S. PATENT DOCUMENTS

| | | | | |
|---|---|---|---|---|
| 5,266,511 A * | 11/1993 | Takao | H10D 84/038 257/E21.705 |
| 10,262,950 B1 | 4/2019 | Alston et al. | |
| 11,437,378 B2 | 9/2022 | Jin | |
| 2014/0206162 A1* | 7/2014 | Eguchi | H10D 30/028 438/268 |
| 2015/0206873 A1* | 7/2015 | Chang | H10D 30/60 438/294 |
| 2021/0280585 A1* | 9/2021 | Jin | H10D 30/024 |

(Continued)

FOREIGN PATENT DOCUMENTS

| | | |
|---|---|---|
| KR | 20190050985 | 5/2019 |
| KR | 20220065662 | 5/2022 |

*Primary Examiner* — Mohammad M Hoque
(74) *Attorney, Agent, or Firm* — Fish & Richardson P.C.

(57) ABSTRACT

The present disclosure relates to semiconductor device fabricating methods. An example semiconductor device fabricating method comprises forming a substrate including a chip area and an outside chip area and having a first surface and a second surface opposite to the first surface, forming a first trench, having a first width on the first surface, in the outside chip area of the substrate, forming a second trench, having a second width smaller than the first width, within the first trench, forming a first overlay key filling the first trench and the second trench, forming an active pattern on the first surface of the substrate, forming a source/drain pattern and a gate electrode on the active pattern in the chip area, and forming a backside contact on the second surface using a bottom surface of the first overlay key in the second trench.

20 Claims, 29 Drawing Sheets

(56) References Cited

U.S. PATENT DOCUMENTS

| | | | |
|---|---|---|---|
| 2021/0375851 | A1 | 12/2021 | Peng et al. |
| 2022/0028895 | A1 | 1/2022 | Kim et al. |
| 2022/0157723 | A1 | 5/2022 | Park et al. |
| 2022/0270924 | A1 | 8/2022 | La Tulipe et al. |
| 2023/0050645 | A1* | 2/2023 | Chen .................... H10D 30/014 |
| 2023/0369141 | A1* | 11/2023 | Kim ........................ H10B 41/10 |
| 2024/0321955 | A1* | 9/2024 | Kiyosawa ............ H10D 12/031 |
| 2026/0122938 | A1* | 4/2026 | Takahashi ............ H10D 12/415 |

* cited by examiner

SEMICONDUCTOR DEVICE FABRICATING METHOD

CROSS-REFERENCE TO RELATED APPLICATION

This application claims priority to Korean Patent Application No. 10-2023-0057683, filed on May 3, 2023, in the Korean Intellectual Property Office, the disclosure of which is hereby incorporated by reference in its entirety.

BACKGROUND

As one of the scaling techniques for increasing a density of semiconductor devices, a multi-gate transistor in which a multi-channel active pattern (or silicon body) having a fin or nanowire shape is formed on a substrate and a gate is formed on a surface of the multi-channel active pattern has been proposed.

Since such a multi-gate transistor uses a three-dimensional channel, it can simplify scaling. In addition, it is possible to improve current control capability without increasing a length of the gate of the multi-gate transistor. In addition, it is possible to effectively suppress a short channel effect (SCE) in which a potential of a channel region is affected by a drain voltage.

Meanwhile, as a pitch size of the semiconductor device decreases, research into reducing capacitance and securing electrical stability between contacts in the semiconductor device is being conducted.

SUMMARY

The present disclosure relates to semiconductor device fabricating methods that may improve product reliability.

In some implementations, a semiconductor device fabricating method comprises forming a substrate including a chip area and an outside chip area and having first and second surfaces opposite to each other, forming a first trench having a first width on the first surface, in the outside chip area of the substrate, forming a second trench having a second width smaller than the first width within the first trench, forming a first overlay key filling the first trench and the second trench, forming an active pattern on the first surface of the substrate, forming a source/drain pattern and a gate electrode on the active pattern in the chip area and forming a backside contact on the second surface using a lower surface of the first overlay key in the second trench.

In some implementations, a semiconductor device fabricating method comprises forming a substrate including a chip area and an outside chip area and having first and second surfaces opposite to each other, forming a first overlay key including a first portion having a first width and a second portion disposed below the first portion and having a second width smaller than the first width in the outside chip area, forming an active pattern on the first surface of the substrate, forming a source/drain pattern and a gate electrode on the active pattern in the chip area, forming a backside contact penetrating through the substrate on the second surface using the first overlay key and forming a backside wiring line connected to the backside contact.

In some implementations, a semiconductor device fabricating method comprises forming a substrate including a chip area and an outside chip area and having first and second surfaces opposite to each other, forming a first trench having a first width on the first surface, in the outside chip area of the substrate, forming a plurality of sheet patterns extending along the first trench and the first surface in the outside chip area and the chip area, forming a second trench penetrating through the plurality of sheet patterns in the first trench and the substrate and having a second width smaller than the first width in the outside chip area, forming a third trench penetrating through the plurality of sheet patterns on the first surface and spaced apart from the first trench in the outside chip area, forming a first overlay key filling the first trench and the second trench, forming a second overlay key filling the third trench, forming a source/drain pattern and a gate electrode on the plurality of sheet patterns in the chip area, forming a source/drain contact on the source/drain pattern, forming a gate contact on the gate electrode, removing a portion of the substrate on the second surface such that a lower surface of the first overlay key in the second trench is exposed, aligning a mask layer on the second surface using the lower surface of the first overlay key, forming a contact hole on the second surface of the substrate using the mask layer, forming a backside contact filling the contact hole and forming a backside wiring line connected to the backside contact.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary implementations thereof with reference to the attached drawings.

DETAILED DESCRIPTION

Figure 1:
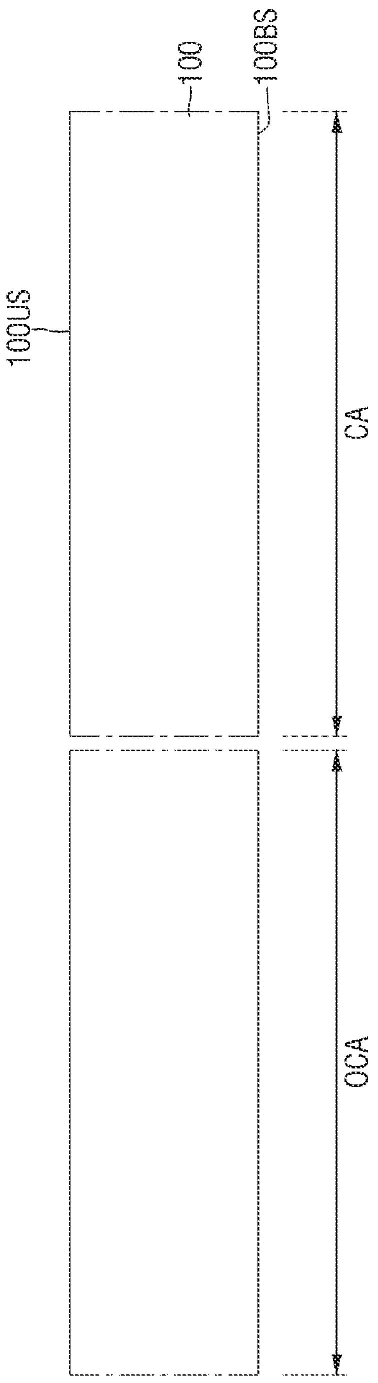
FIGS. 1 to 15 are views for describing an example of a semiconductor device fabricating method.

Terms "first", "second", and the like are used herein to describe various elements or components, but these elements or components are not limited by these terms. These terms are used only to distinguish one element or component from another element or component. Therefore, a first element or component mentioned below may be a second element or component within the technical spirit of the present disclosure.

In the drawings of a semiconductor device according to some exemplary implementations, a fin-type transistor (FinFET) including a channel region having a fin-type pattern shape, a transistor including nanowires or nanosheets, and a multi-bridge channel field effect transistor (MBCFET™) are exemplarily illustrated, but the present disclosure is not limited thereto.

The semiconductor device according to some exemplary implementations may include a tunneling FET, a three-dimensional (3D) transistor, or a vertical FET. The semiconductor device according to some exemplary implementations includes a planar transistor. In addition, a technical idea of the present disclosure may be applied to two-dimensional (2D) material based FETs and a heterostructure thereof. In addition, the semiconductor device according to some exemplary implementations also includes a bipolar junction transistor, a lateral double-diffused metal oxide semiconductor (LDMOS) transistor, or the like.

FIGS. 1 to 15 are views for describing an example of a semiconductor device fabricating method.

Referring to FIG. 1, a substrate 100 including a chip area CA and an outside chip area OCA is formed.

The substrate 100 may have a first surface 100US and a second surface 100BS. For example, in the chip area CA, the substrate 100 may have the first surface 100US and the second surface 100BS. Likewise, even in the outside chip area OCA, the substrate 100 may have the first surface 100US and the second surface 100BS.

Figure 2:
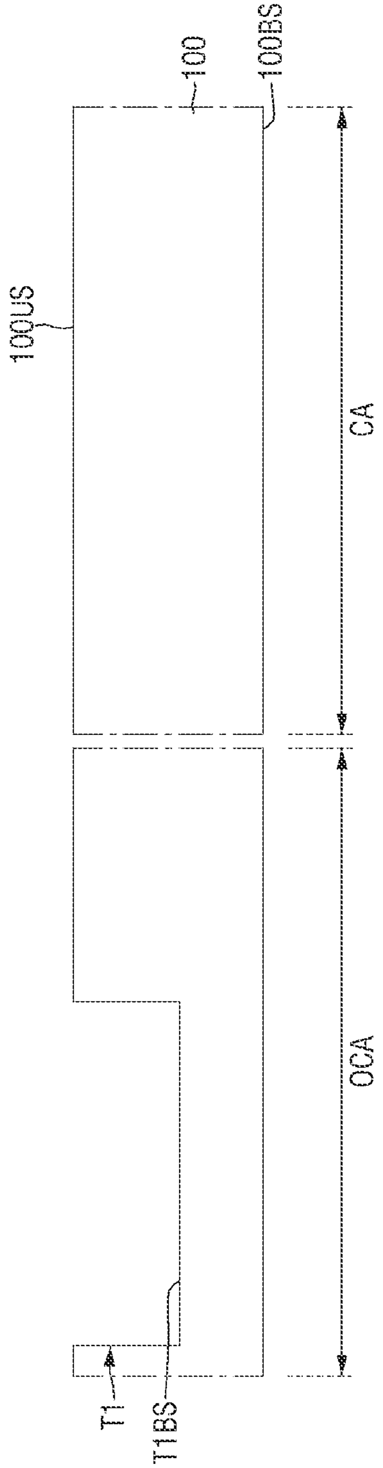

Referring to FIG. 2, a first trench T1 is formed in the outside chip area OCA.

The first trench T1 may be formed on the first surface 100US of the substrate 100 in the outside chip area OCA. The first trench T1 may penetrate through the first surface 100US of the substrate 100 in the outside chip area OCA. A bottom surface T1BS of the first trench T1 may be disposed between the first surface 100US and the second surface 100BS of the substrate 100. That is, the first trench T1 may not completely penetrate through the substrate 100.

Figure 3:
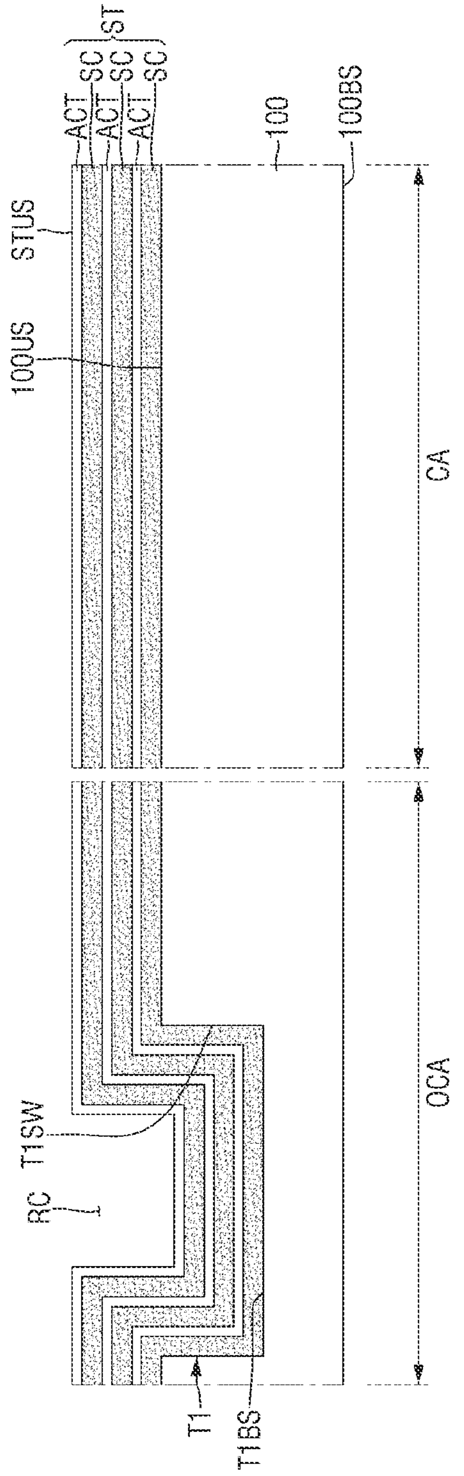

Referring to FIG. 3, a stacked film structure ST is formed on the substrate 100.

The stacked film structure ST may include a plurality of sacrificial films SC and a plurality of active films ACT. The plurality of sacrificial films SC and the plurality of active films ACT may be alternately stacked. For example, the sacrificial film SC may include a silicon-germanium film. The active film ACT may include a silicon film.

The stacked film structure ST may extend over the chip area CA and the outside chip area OCA. The stacked film structure ST may be formed on the first surface 100US of the substrate 100. The stacked film structure ST may extend along a profile of the first surface 100US of the substrate 100 and the first trench T1.

The stacked film structure ST may extend along the bottom surface T1BS and the side surface T1SW of the first trench T1. In the first trench T1, the stacked film structure ST may form a recess RC. That is, an upper surface of the stacked film structure ST extending along the bottom surface T1BS and side surface T1SW of the first trench T1 may form the recess RC.

Figure 4:
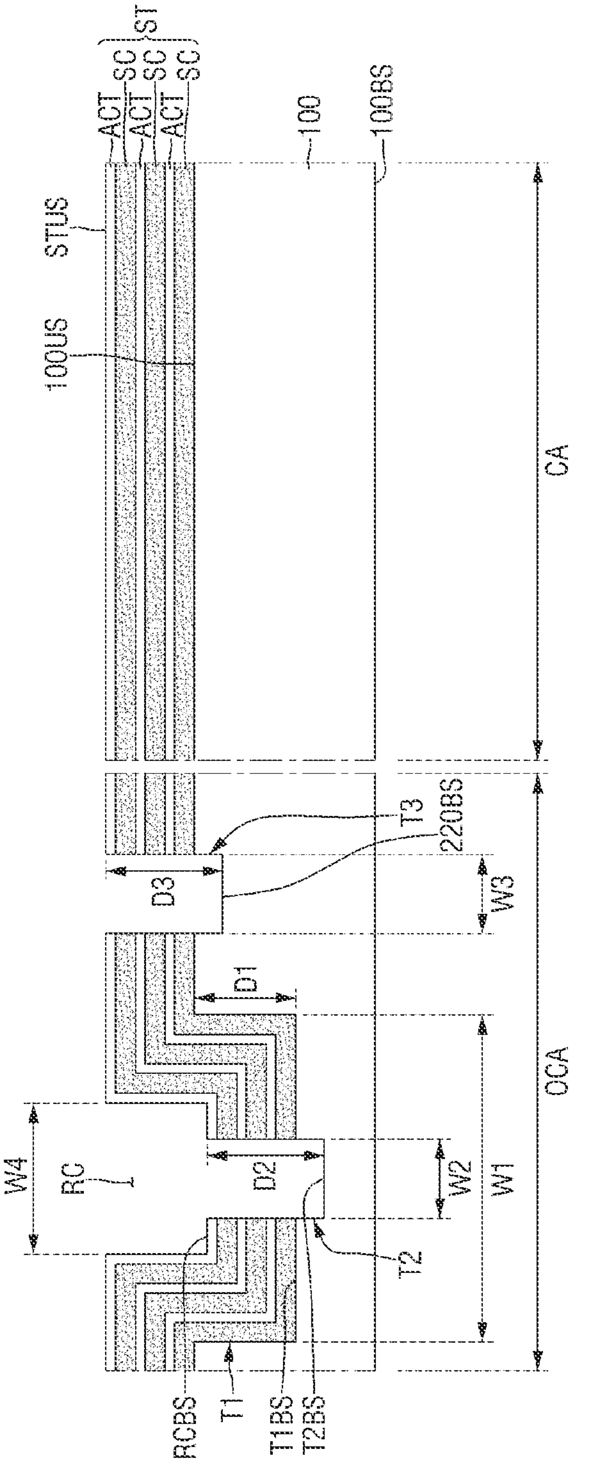

Referring to FIG. 4, a second trench T2 and a third trench T3 is formed on the substrate 100.

The second trench T2 and the third trench T3 may be disposed in the outside chip area OCA. The second trench T2 and the third trench T3 may be formed on the first surface 100US of the substrate 100 in the outside chip area OCA. The second trench T2 and the third trench T3 may penetrate through the first surface 100US of the substrate 100.

The second trench T2 may be formed within the first trench T1. In plan view, the second trench T2 may overlap the first trench T1. The second trench T2 may penetrate through a bottom surface T1BS of the first trench T1. The second trench T2 may penetrate through the stacked film structure ST in the first trench T1. The second trench T2 may cut the stacked film structure ST in the first trench T1. The second trench T2 may be disposed on a lower of the recess RC of the stacked film structure ST. In plan view, the second trench T2 may overlap the recess RC of the stacked film structure ST. The second trench T2 may penetrate through a bottom surface RCBS of the recess RC of the stacked film structure ST.

A bottom surface T2BS of the second trench T2 may be disposed between the first surface 100US and the second surface 100BS of the substrate 100. That is, the second trench T2 may not completely penetrate through the substrate 100. The bottom surface T2BS of the second trench T2 may be disposed below the bottom surface T1BS of the first trench T1. The bottom surface T2BS of the second trench T2 may be disposed closer to the second surface 100BS of the substrate 100 than the bottom surface T1BS of the first trench T1.

The first trench T1 may have a first width W1. The first trench T1 may have a first depth D1. The first depth D1 of the first trench T1 may refer to a distance from the first surface 100US of the substrate 100 to the bottom surface T1BS of the first trench T1.

The second trench T2 may have a second width W2. The second trench T2 may have a second depth D2. The second depth D2 of the second trench T2 refers to a distance from the bottom surface RCBS of the recess RC of the stacked film structure ST to the bottom surface T2BS of the second trench T2.

The recess RC of the stacked film structure ST may have a fourth width W4.

The second width W2 of the second trench T2 may be smaller than the first width W1 of the first trench T1. The second width W2 of the second trench T2 may be smaller than the fourth width W4 of the recess RC of the stacked film structure ST. The second depth D2 of the second trench T2 may be greater than the first depth D1 of the first trench T1. However, the exemplary implementation is not limited thereto. For example, the second depth D2 of the second trench T2 may be equal to or smaller than the first depth D1 of the first trench T1.

The third trench T3 may be spaced apart from the first trench T1 and the second trench T2. The third trench T3 may penetrate through the stacked film structure ST disposed on the first surface 100US of the substrate 100. The third trench T3 may penetrate through the first surface 100US of the substrate 100.

The third trench T3 may have a third width W3. The third trench T3 may have a third depth D3. The third depth D3 of the third trench T3 may refer to a distance from the upper surface of the stacked film structure ST to a bottom surface T3BS of the third trench T3. The third width W3 of the third trench T3 may be smaller than the first width W1 of the first trench T1. The third depth D3 of the third trench T3 may be equal to the second depth D2 of the second trench T2. However, the exemplary implementation is not limited thereto. For example, the third depth D3 of the third trench T3 may be greater than the second depth D2 of the second trench T2.

Figure 5:
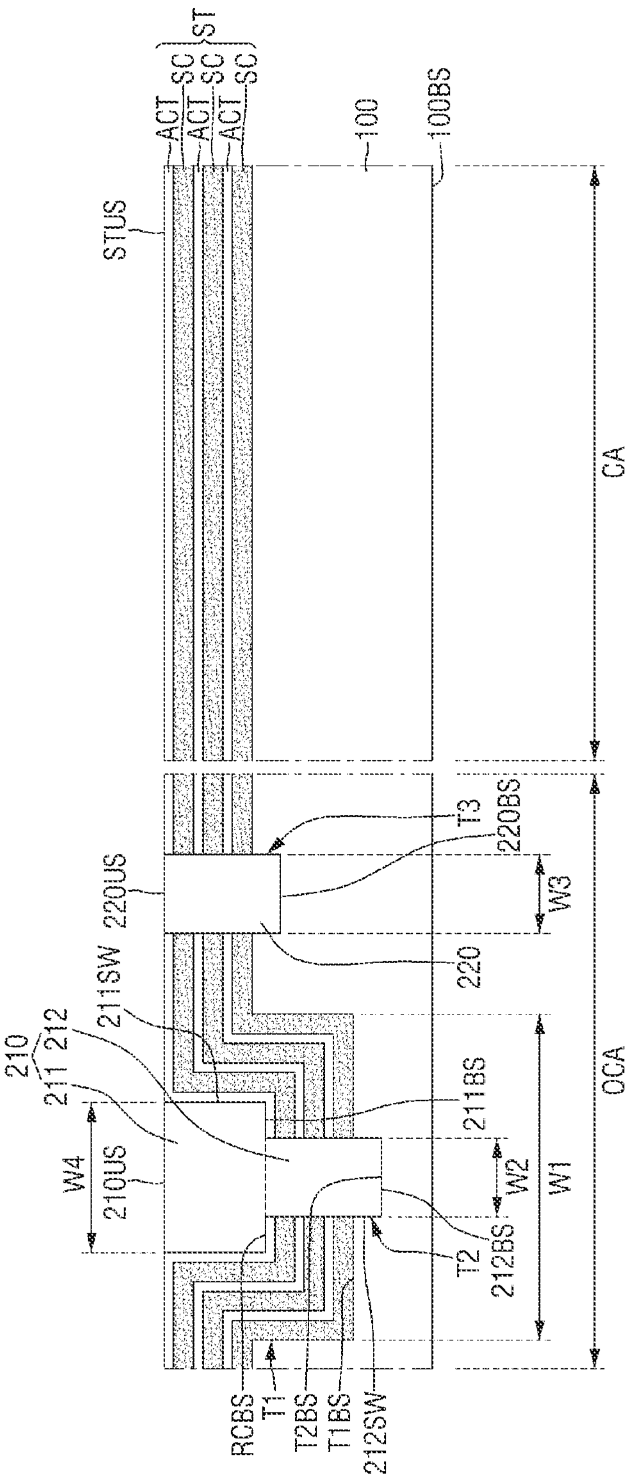

Referring to FIG. 5, a first overlay key 210 and a second overlay key 220 is formed.

The first overlay key 210 and the second overlay key 220 may be formed in the outside chip area OCA. The first overlay key 210 may fill the first trench T1 and the second trench T2. The second overlay key 220 may fill the third trench T3. The first overlay key 210 and the second overlay key 220 may include an oxide film. For example, the first overlay key 210 and the second overlay key 220 may include silicon oxide.

An upper surface 210US of the first overlay key 210 may be disposed on the same plane as an upper surface STUS of the stacked film structure ST. The upper surface 210US of the first overlay key 210 may be disposed above the first surface 100US of the substrate 100. An upper surface 220US of the second overlay key 220 may be disposed on the same plane as the upper surface STUS of the stacked film structure ST. The upper surface 210US of the first overlay key 210 and the upper surface 220US of the second overlay key 220 may be disposed on the same plane.

The first overlay key 210 may include a first portion 211 and a second portion 212. The first portion 211 may be disposed on the second portion 212. The first portion 211 may cover the second portion 212. The first portion 211 may vertically overlap the second portion 212.

The first portion 211 may be disposed on the first trench T1. The first portion 211 may be formed in the recess (RC in FIG. 4) of the stacked film structure ST. The first portion 211 may fill the recess (RC in FIG. 4) of the stacked film structure ST. The first portion 211 may have a fourth width W4. That is, the first portion 211 filling the recess (RC in FIG. 4) of the stacked film structure ST may have the same width as the fourth width W4 of the recess (RC in FIG. 4) of the stacked film structure ST. The first portion 211 may be disposed on the stacked film structure ST. A lower surface 211BS and a side surface 211SW of the first portion 211 may be surrounded by the stacked film structure ST.

The second portion 212 may be disposed below the first portion 211. The second portion 212 may be connected to the first portion 211. The second portion 212 may protrude from the first portion 211 toward the second surface 100BS of the substrate 100. The second portion 212 may be disposed within the second trench T2. The second portion 212 may be disposed within the substrate 100. A lower surface 212BS of the second portion 212 may be disposed below the bottom surface T1BS of the first trench T1. That is, the lower surface 212BS of the second portion 212 may protrude toward the second surface 100BS of the substrate 100 rather than the stacked film structure ST in the outside chip area OCA. A portion of a side surface 212SW of the second portion 212 may be surrounded by the stacked film structure ST.

The second portion 212 may fill the second trench T2. The second portion 212 may penetrate through the stacked film structure ST in the first trench T1. The second portion 212 may have a second width W2. That is, the second portion 212 filling the second trench T2 may have the same width as the second width W2 of the second trench T2.

The second overlay key 220 may be spaced apart from the first overlay key 210. The second overlay key 220 may penetrate through the stacked film structure ST. In the outside chip area OCA, the second overlay key 220 may cut the stacked film structure ST. A lower surface 212BS of the second overlay key 220 may protrude toward the second surface 100BS of the substrate 100 rather than the lower surface of the stacked film structure ST.

The second overlay key 220 may have a constant width. For example, the second overlay key 220 may have a third width W3. The second overlay key 220 filling the third trench T3 may have the same width as the third width W3 of the third trench T3.

Figure 6:
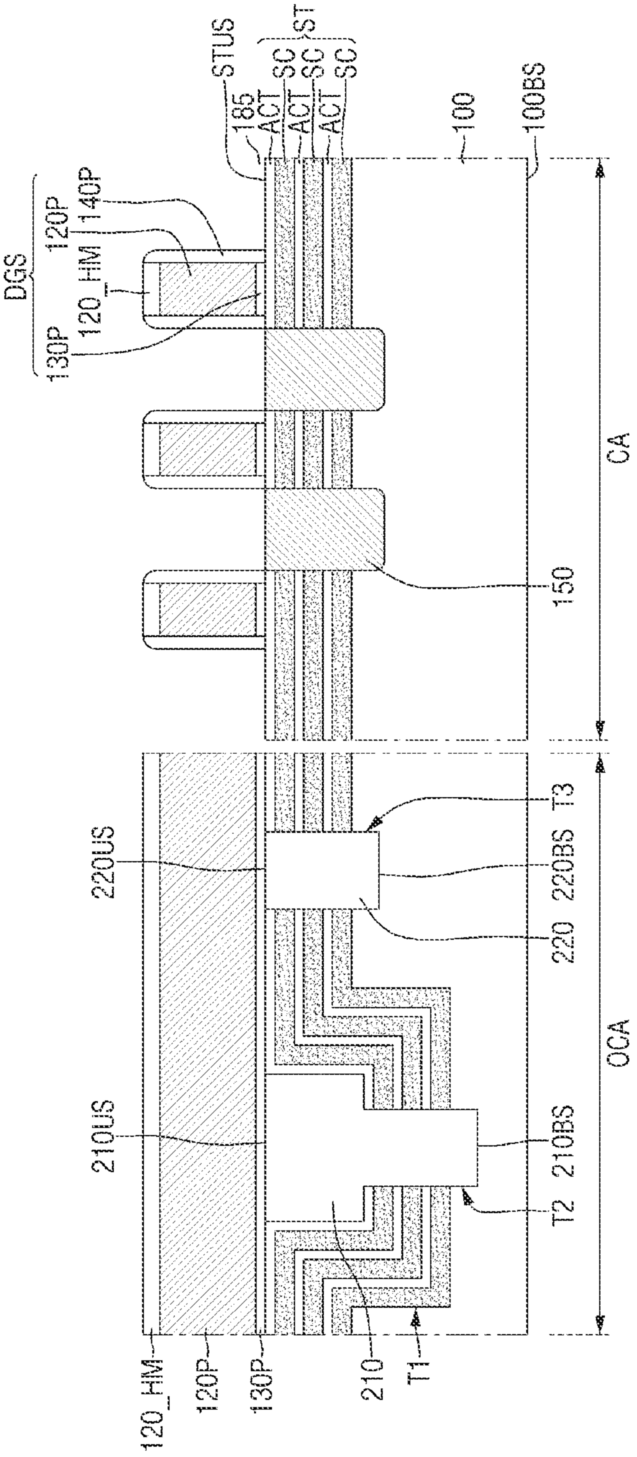

Referring to FIG. 6, a source/drain pattern 150 and a dummy gate structure DGS are formed on the substrate 100.

The source/drain pattern 150 and the dummy gate structure DGS may be formed on the substrate 100 in the chip area CA. The source/drain pattern 150 may be disposed on the substrate 100. The source/drain pattern 150 may be formed within the stacked film structure ST. The source/drain pattern 150 may be in contact with the active film ACT of the stacked film structure ST. In the implementations illustrated herein, the phrase source/drain pattern may be understood to mean a source terminal pattern or a drain terminal pattern of a transistor.

The dummy gate structure DGS may include a dummy gate electrode 120P, a dummy gate capping film 120_HM, a dummy gate insulating film 130P, and a pre-gate spacer 140P.

The dummy gate insulating film 130P, the dummy gate electrode 120P, and the dummy gate capping film 120_HM may be formed on the substrate 100 in the outside chip area OCA. In the outside chip area OCA, the dummy gate insulating film 130P, the dummy gate electrode 120P, and the dummy gate capping film 120_HM may extend along the upper surface STUS of the stacked film structure, the upper surface 210US of the first overlay key 210, and the upper surface 220US of the second overlay key 220. In the outside chip area OCA, the dummy gate insulating film 130P, the dummy gate electrode 120P, and the dummy gate capping film 120_HM may cover the upper surface STUS of the stacked film structure, the upper surface 210US of the first overlay key 210, and the upper surface 220US of the second overlay key 220.

The dummy gate structure DGS may be aligned using the upper surface 210US of the first overlay key 210 or the upper surface 220US of the second overlay key 220. For example, a mask for patterning the dummy gate structure DGS may be aligned using the first overlay key 210 or the second overlay key 220.

Figure 7:
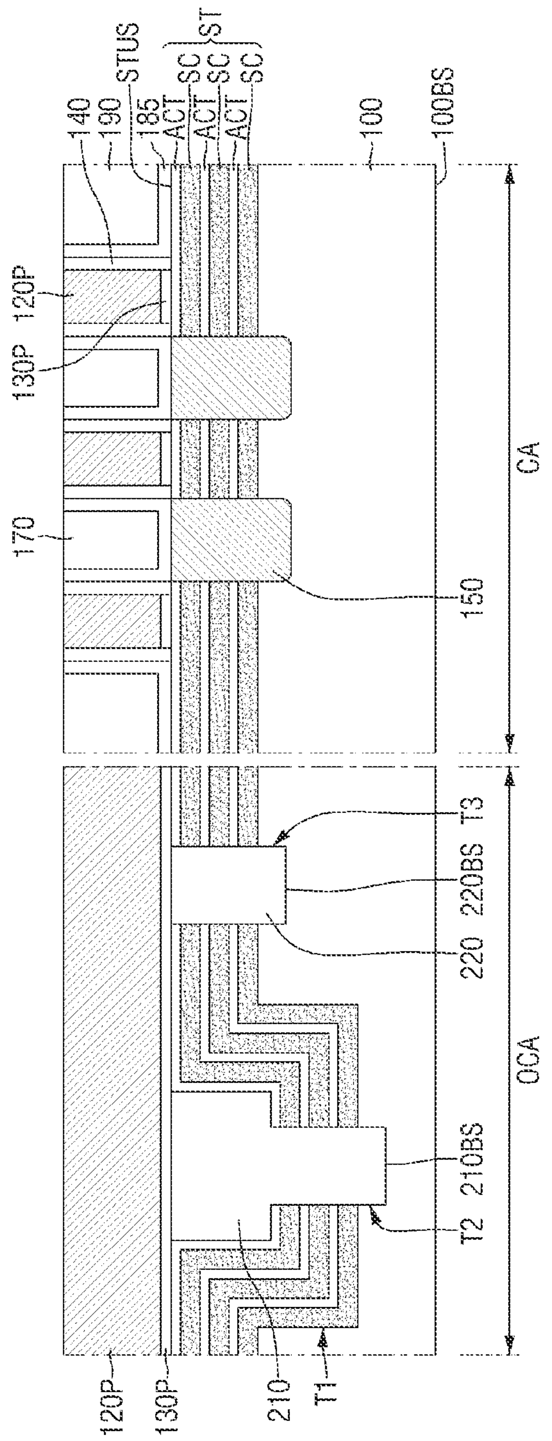

Referring to FIG. 7, a source/drain etch stop film 185 and a first upper interlayer insulating film 190 are formed on the source/drain pattern 150.

While forming the first upper interlayer insulating film 190, the dummy gate capping film 120_HM may be removed to expose an upper surface of the dummy gate electrode 120P. While the upper surface of the dummy gate electrode 120P is exposed, a gate spacer 140 may be formed.

Figure 8:
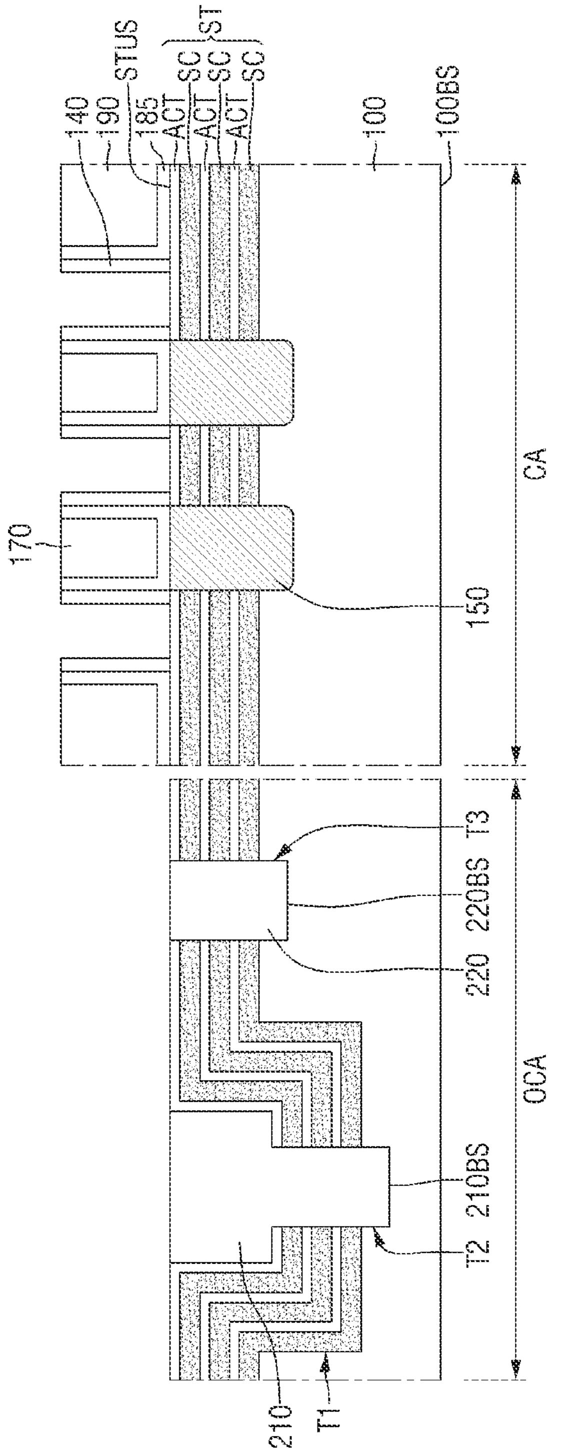

Referring to FIG. 8, the dummy gate insulating film 130P and the dummy gate electrode 120P are removed.

As the dummy gate insulating film 130P and the dummy gate electrode 120P are removed, the stacked film structure ST may be exposed. The upper surface STUS of the stacked film structure ST may be exposed between the gate spacers 140 in the chip area CA. The upper surface STUS of the stacked film structure ST, the upper surface 210US of the first overlay key 210, and the upper surface 220US of the second overlay key 220 may be exposed in the outside chip area OCA.

Figure 9:
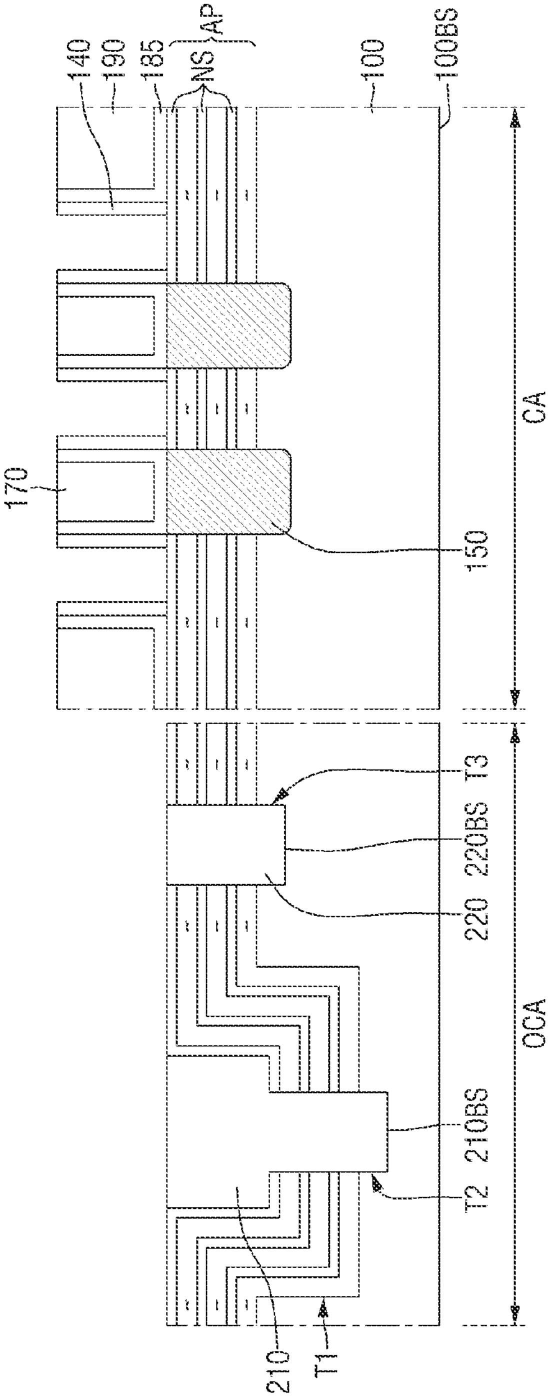

Referring to FIG. 9, the sacrificial film SC of the stacked film structure ST are removed.

The sacrificial film SC may be removed to form a sheet pattern NS. An active pattern AP including a plurality of sheet patterns NS may be formed on the substrate 100. The sheet pattern NS may be stacked on the substrate 100. The sheet pattern NS may be disposed on the first surface 100US of the substrate 100.

Figure 10:
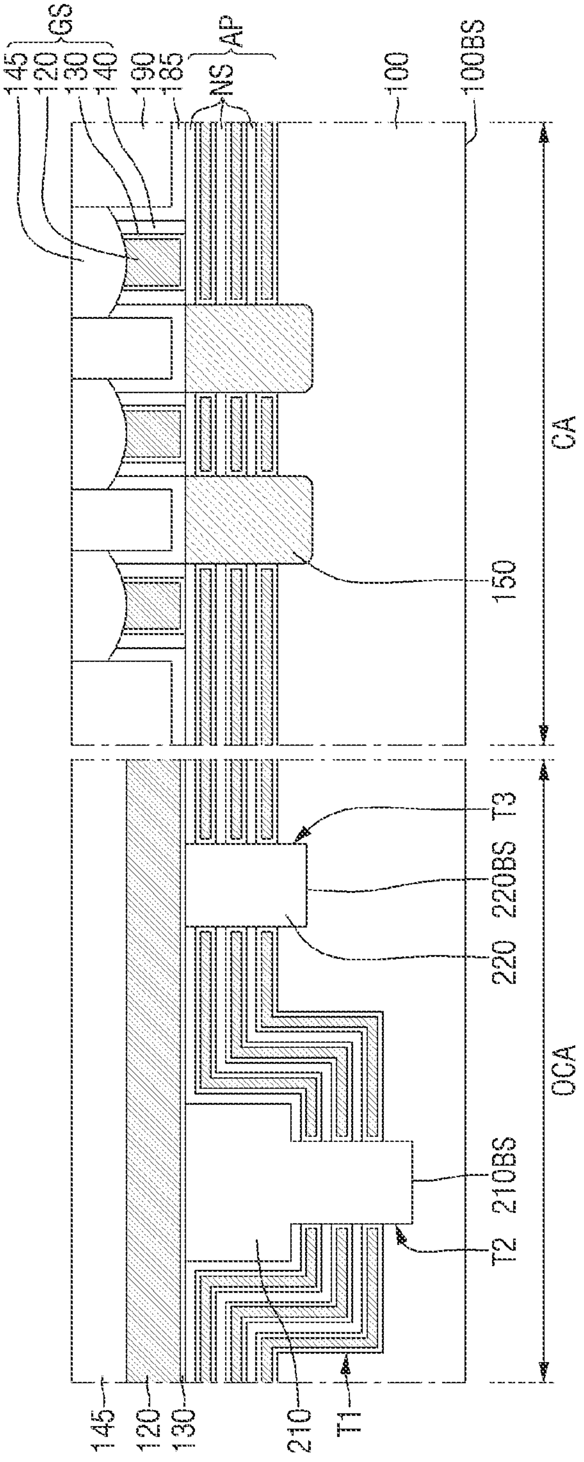

Referring to FIG. 10, a gate structure GS are formed.

A gate insulating film 130 and a gate electrode 120 may be formed on the sheet pattern NS. A gate capping film 145 may be formed on the gate electrode 120.

Figure 11:
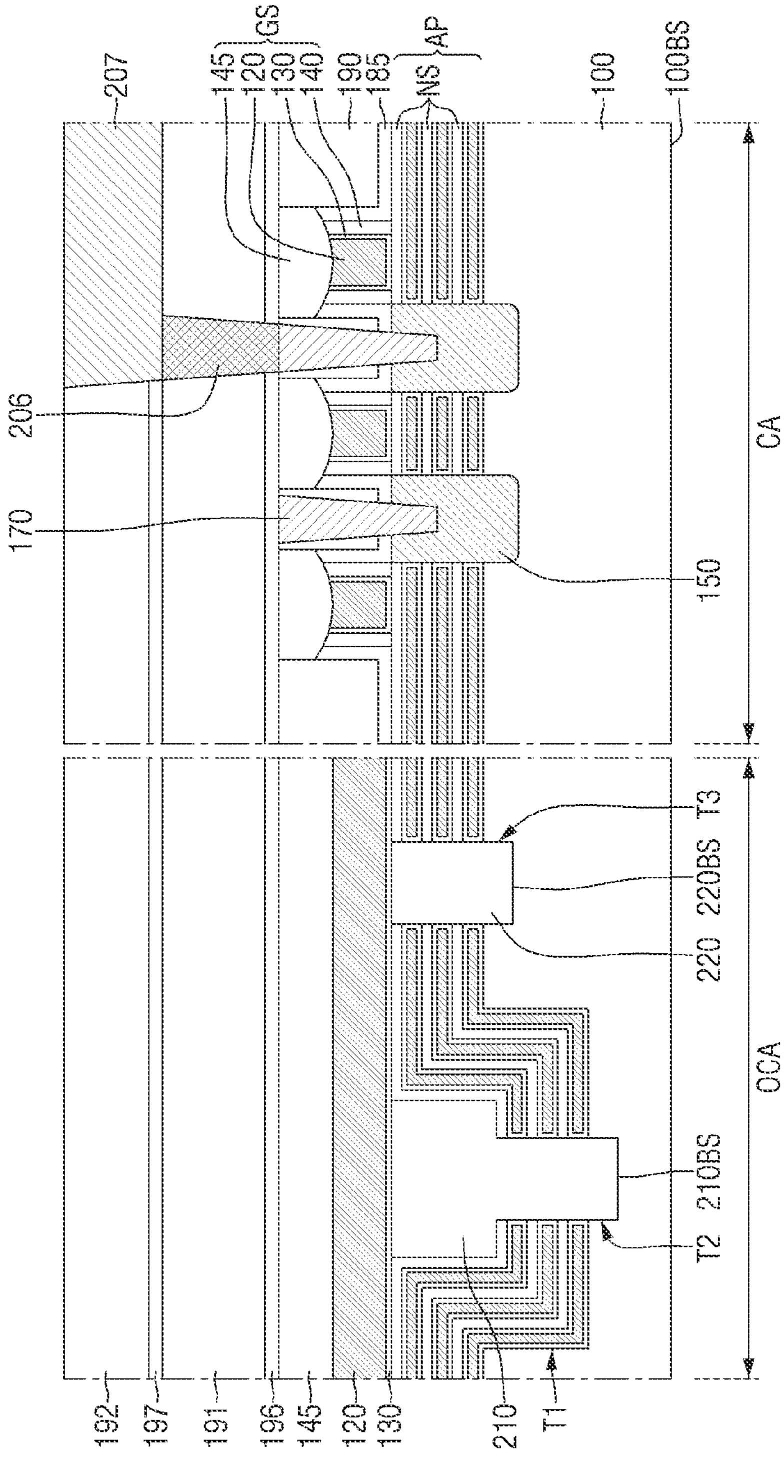

Referring to FIG. 11, a source/drain contact 170, a frontside wiring via 206, and a frontside wiring line 207 are formed.

The source/drain contact 170 may be formed on the source/drain pattern 150. The source/drain contact 170 may penetrate through the first upper interlayer insulating film 190 and the source/drain etch stop film 185.

A first etch stop film 196, a second upper interlayer insulating film 191, a second etch stop film 197, and a third upper interlayer insulating film 192 may be formed on the gate structure GS. The first etch stop film 196, the second upper interlayer insulating film 191, the second etch stop film 197, and the third upper interlayer insulating film 192 may be sequentially formed across the chip area CA and the outside chip area OCA.

The frontside wiring via 206 may penetrate through the first etch stop film 196 and the second upper interlayer insulating film 191. The frontside wiring via 206 may be formed on the source/drain contact 170. The frontside wiring via 206 may be connected to the source/drain contact 170. However, the exemplary implementation is not limited thereto. For example, although not illustrated, the frontside wiring via 206 may be formed on a gate contact on the gate electrode 120.

The frontside wiring via 207 may penetrate through the second etch stop film 197 and the third upper interlayer insulating film 192. The frontside wiring line 207 may be connected to the frontside wiring via 206.

Although the frontside wiring line 207 and the frontside wiring via 206 are illustrated as a single film in FIG. 11, the exemplary implementation is not limited thereto. For example, the frontside wiring line 207 and the frontside wiring via 206 may have a multilayer structure.

Figure 12:
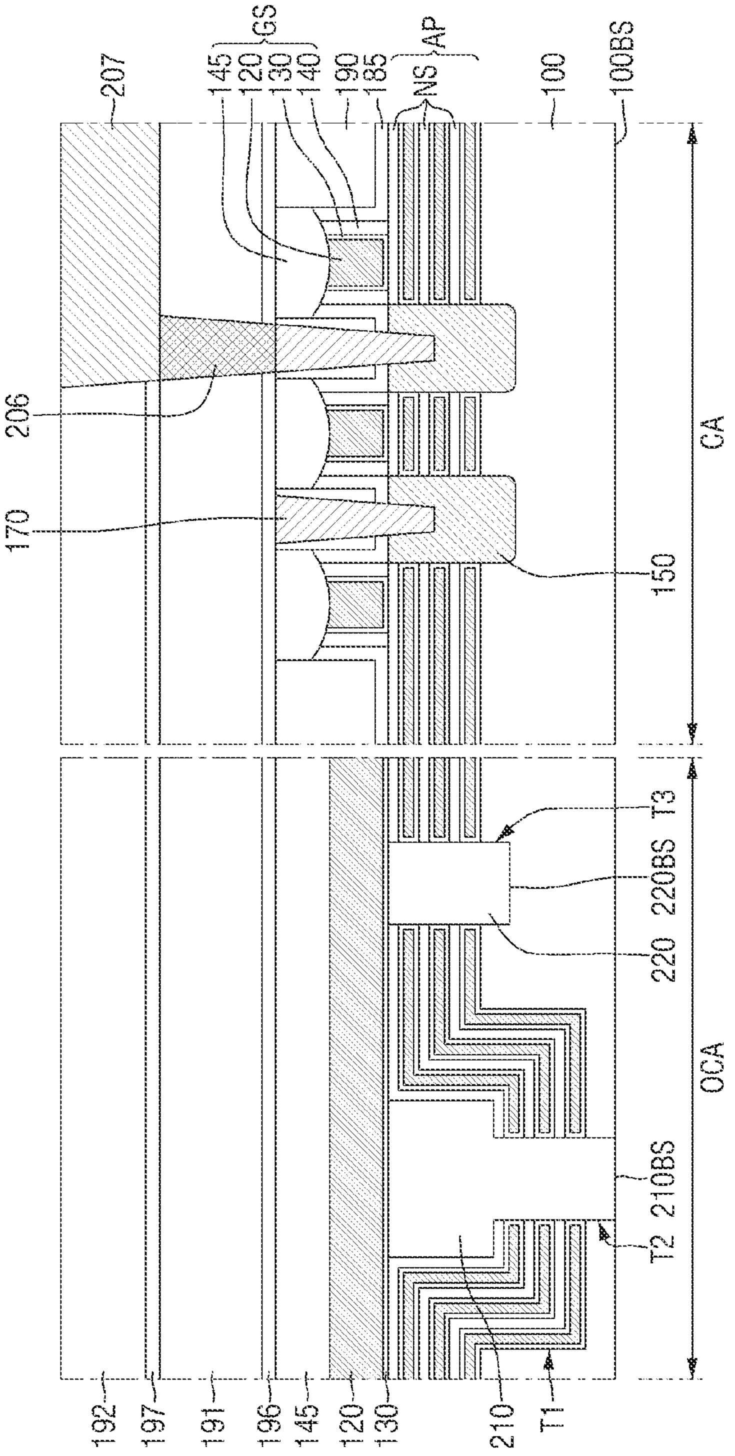

Referring to FIG. 12, a portion of the second surface 100BS of the substrate 100 are removed.

Specifically, a portion of the substrate 100 may be removed from the second surface 100BS of the substrate 100 so that the lower surface 210BS of the first overlay key 210 is exposed. Accordingly, the lower surface 210BS of the first overlay key 210 and the second surface 100BS of the substrate 100 may be disposed on the same plane.

Figure 13:
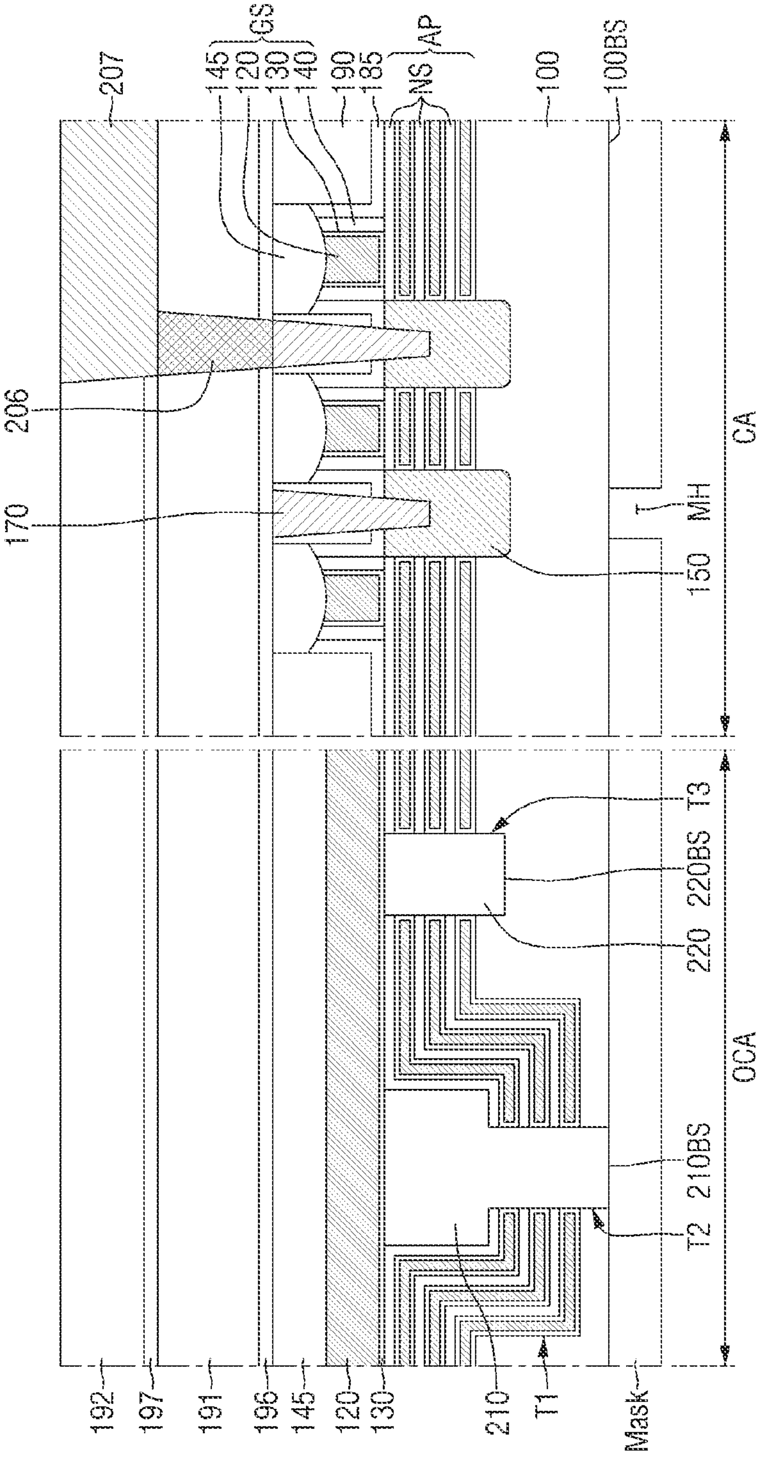

Referring to FIG. 13, a mask layer Mask is aligned on the second surface 100BS of the substrate 100.

The mask layer Mask may include a mask hole MH. The mask layer Mask may be aligned using the first overlay key 210. The mask layer Mask may be disposed on the second surface 100BS of the substrate 100 by using the first overlay key 210 such that the mask hole MH is aligned at a target position. For example, the mask layer Mask may be aligned on the second surface 100BS of the substrate 100 such that the mask hole MH is disposed on the source/drain contact 170. However, the exemplary implementation is not limited thereto. The mask hole MH may be aligned at a position other than a position overlapping the source/drain contact 170.

Figure 14:
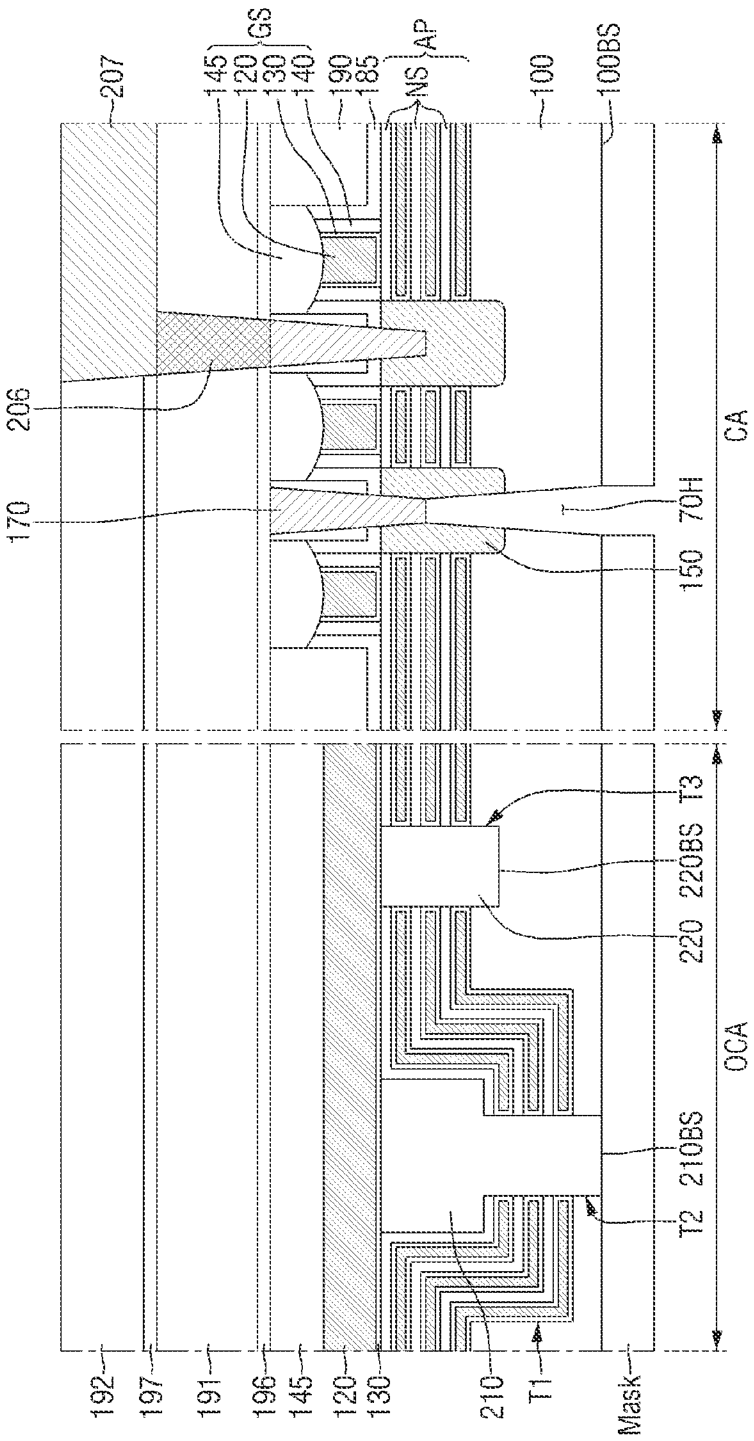

Referring to FIG. 14, a backside contact hole 70H is formed using the mask layer Mask.

The backside contact hole 70H may be formed by etching the substrate 100 using the mask hole MH of the mask layer Mask. For example, the backside contact hole 70H may expose the source/drain contact 170.

Figure 15:
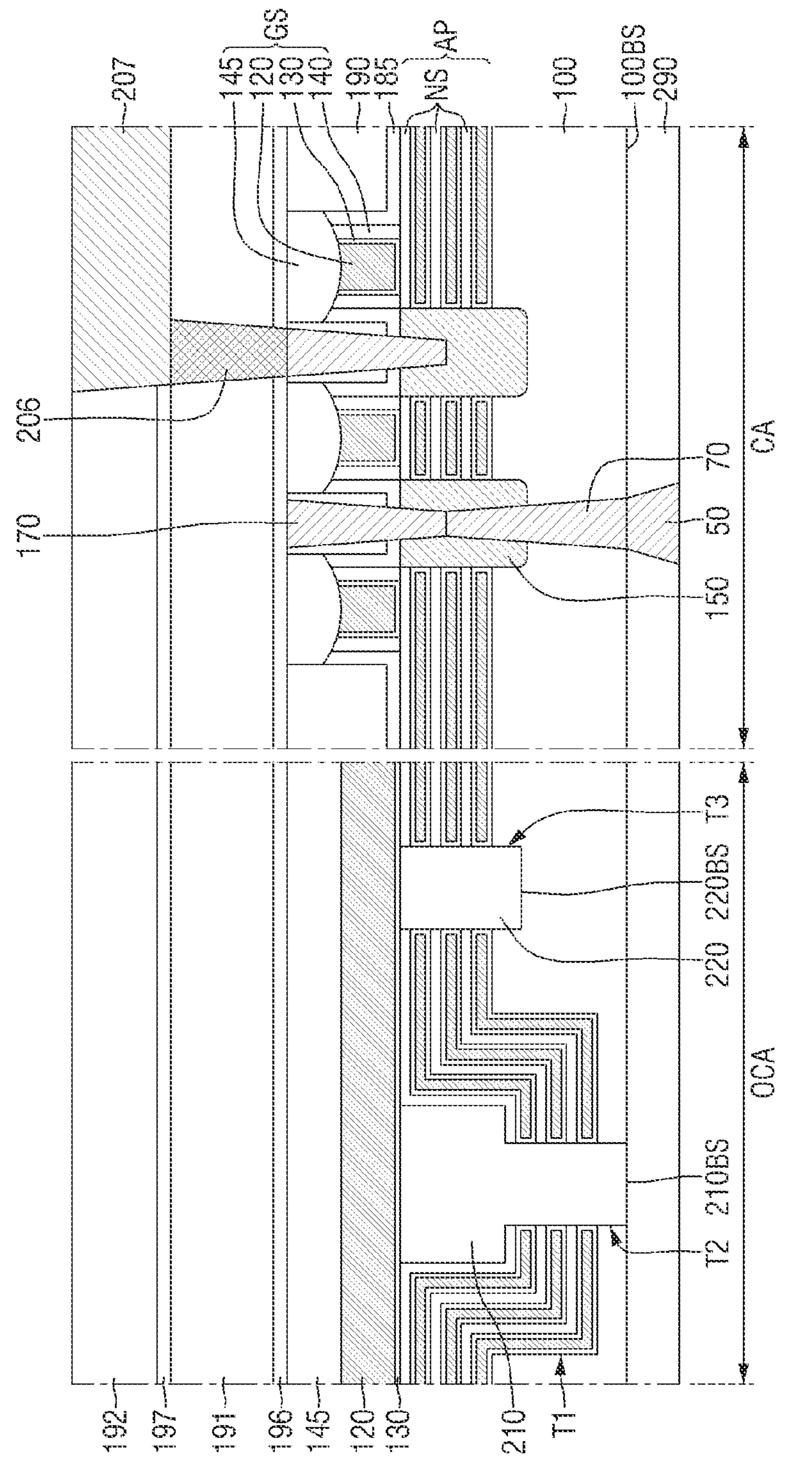

Referring to FIG. 15, a backside contact 70 and a backside wiring line 50 is formed.

The backside contact 70 may fill the backside contact hole (70H in FIG. 14). The backside contact 70 may penetrate through the source/drain pattern 150. The backside contact 70 may be connected to the source/drain contact 170. The backside contact 70 may be in direct contact with the source/drain contact 170.

The backside wiring line 50 may be formed on the second surface 100BS of the substrate 100. The backside wiring line 50 may be connected to the backside contact 70. The backside wiring line 50 may cover an upper surface of the backside contact 70. The backside wiring line 50 may be formed in a lower interlayer insulating film 290. The lower interlayer insulating film 290 may cover the second surface 100BS of the substrate 100.

Figure 22:
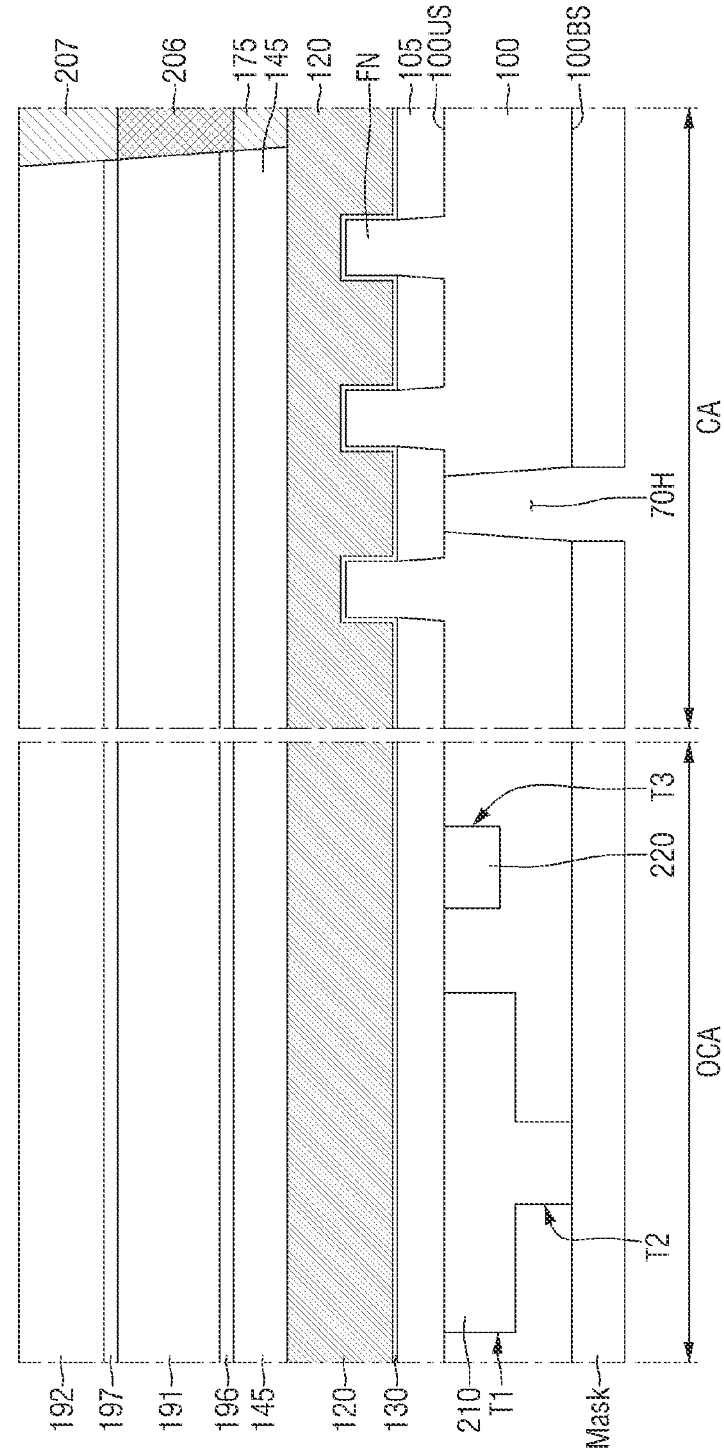
Figure 23:
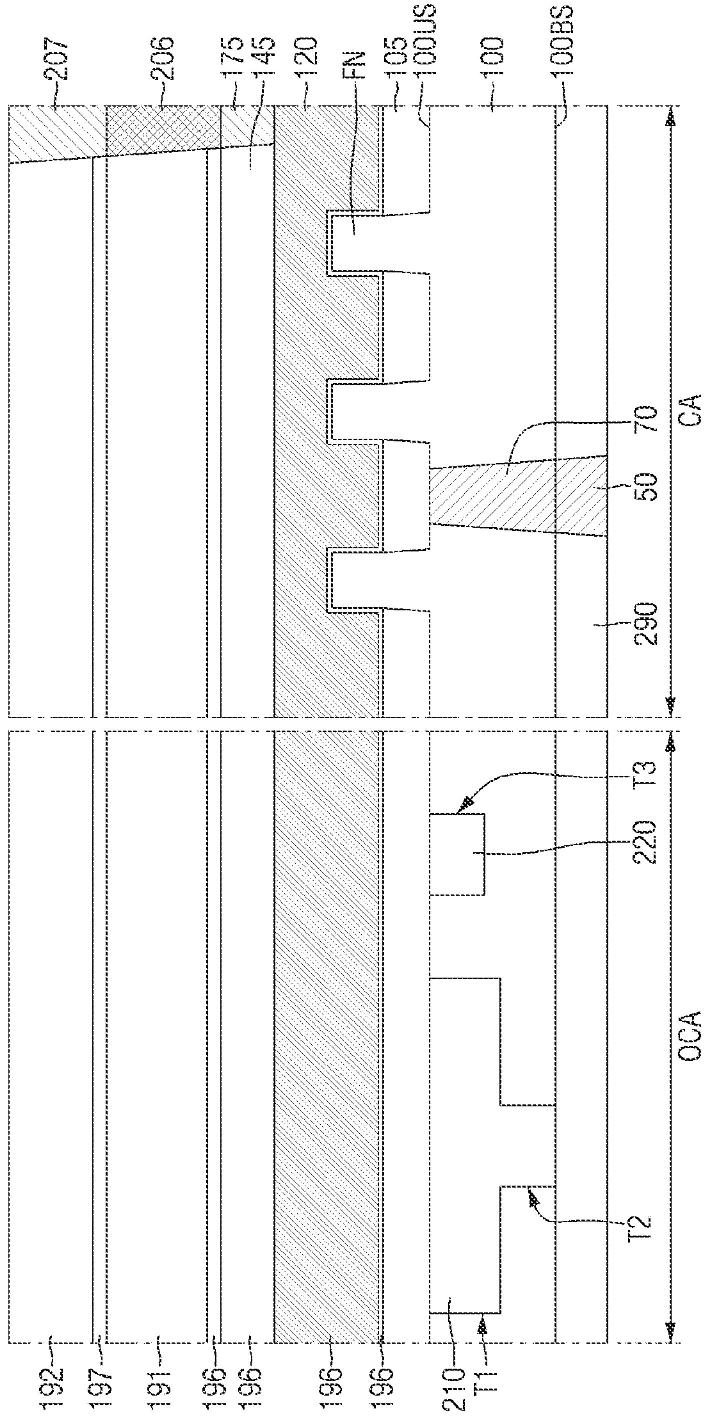
Figure 24:
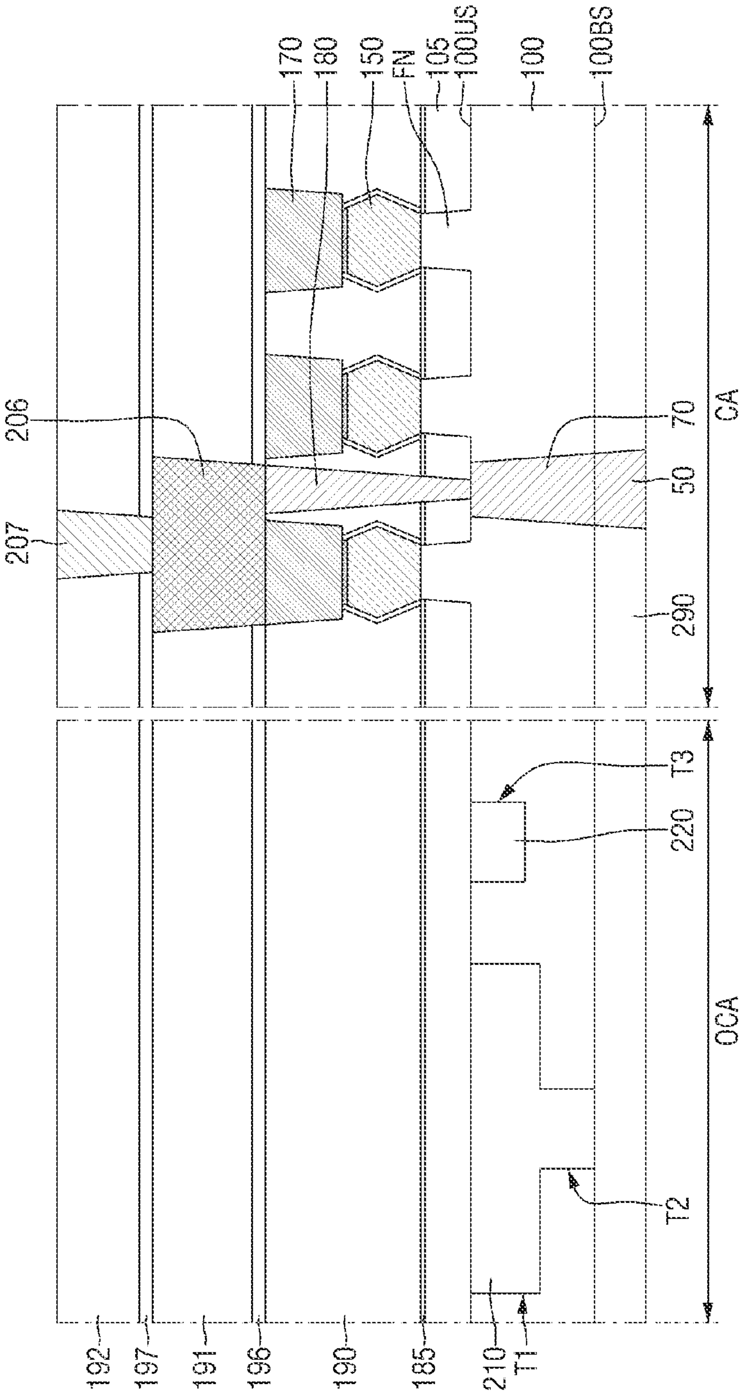

FIGS. 16 to 24 are views for describing another example of a semiconductor device fabricating method. For convenience of explanation, points different from those described with reference to FIGS. 1 to 15 will be mainly described. For reference, FIG. 24 illustrates a cross-sectional view different from FIGS. 16 to 23.

Figure 16:
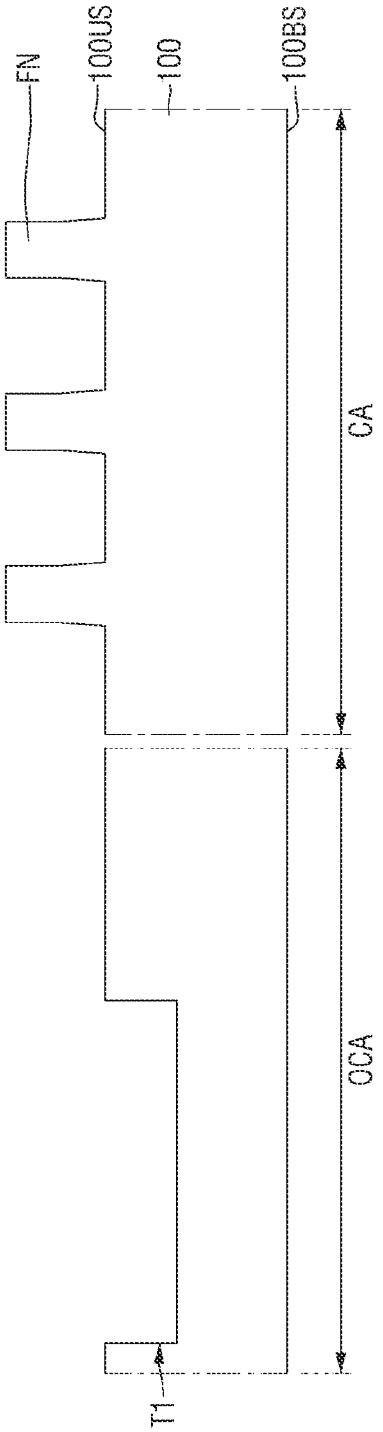
FIGS. 16 to 24 are views for describing another example of a semiconductor device fabricating method.

Referring to FIG. 16, a fin pattern FN and a first trench T1 is formed.

The fin pattern FN may be formed on the first surface 100US of the substrate 100 in the chip area CA. The fin pattern FN may protrude from the first surface 100US of the substrate 100. The first trench T1 may be formed in the outside chip area OCA.

Figure 17:
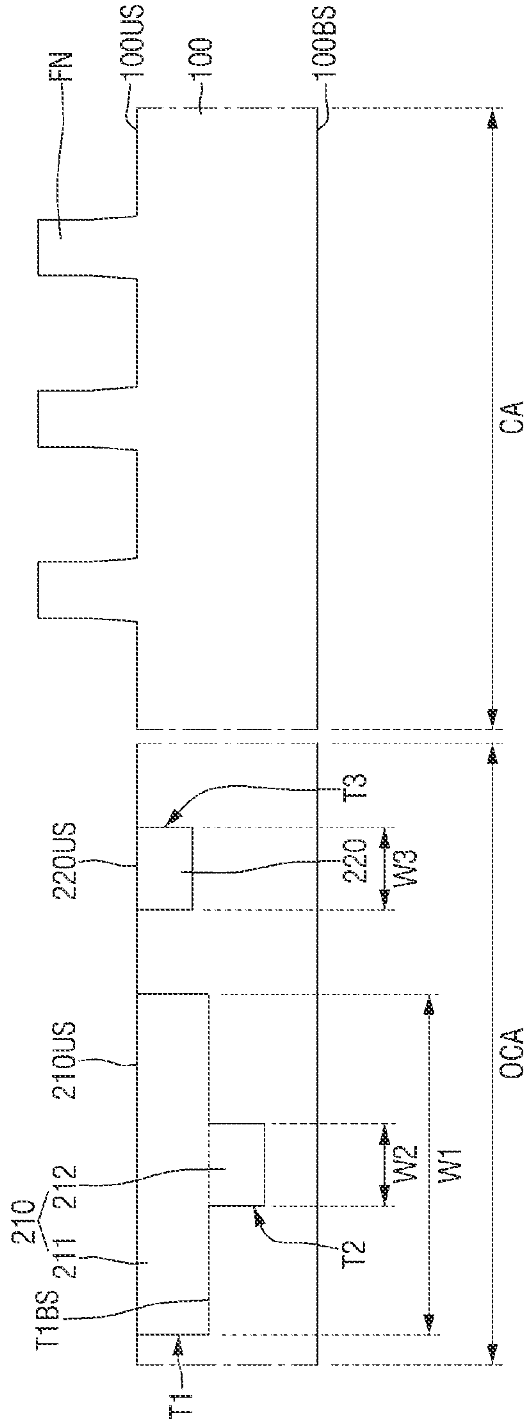

Referring to FIG. 17, a second trench T2, a third trench T3, a first overlay key 210, and a second overlay key 220 is formed.

The second trench T2 and the third trench T3 may be formed in the outside chip area OCA. The second trench T2 may be formed within the first trench T1. The second trench T2 may be formed on a bottom surface T1BS of the first trench T1. The second trench T2 may penetrate through a bottom surface T1BS of the first trench T1. A second width W2 of the second trench T2 may be smaller than a first width W1 of the first trench T1.

The third trench T3 may be formed on the first surface 100US of the substrate 100 in the outside chip area OCA. The third trench T3 may be spaced apart from the first trench T1 and the second trench T2. The third trench T3 may penetrate through the first surface 100US of the substrate 100.

The first overlay key 210 may fill the first trench T1 and the second trench T2. The second overlay key 220 may fill the third trench T3. For example, the first overlay key 210 and the second overlay key 220 may include silicon oxide.

The first overlay key 210 may include a first portion 211 and a second portion 212. The first portion 211 may be disposed on the second portion 212. The first portion 211 may cover the second portion 212. The first portion 211 may vertically overlap the second portion 212. The upper surface 210US of the first overlay key 210 may be disposed on the same plane as the first surface 100US of the substrate 100.

The first portion 211 may be disposed within the first trench T1. The second portion 212 may be disposed below the first portion 211. The second portion 212 may be connected to the first portion 211. The second portion 212 may protrude from the first portion 211 toward the second surface 100BS of the substrate 100. The second portion 212 may be disposed within the second trench T2.

Figure 18:
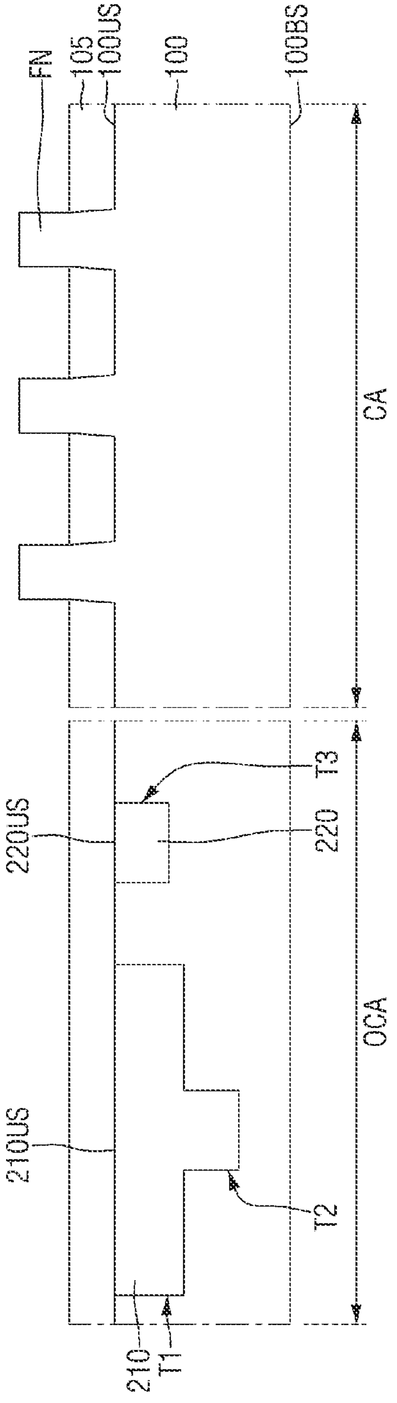

Referring to FIG. 18, a field insulating film 105 is formed.

The field insulating film 105 may be formed on the first surface 100US of the substrate 100. In the chip area CA, the field insulating film 105 may be formed on a portion of a sidewall of the fin pattern FN. In the outside chip area OCA, the field insulating film 105 may extend along the first surface 100US of the substrate 100 and the upper surfaces of the first overlay key 210 and the second overlay key 220. The fin pattern FN may protrude above an upper surface of the field insulating film 105. The field insulating film 105 may include, for example, an oxide film, a nitride film, an oxynitride film, or a combination thereof.

Figure 19:
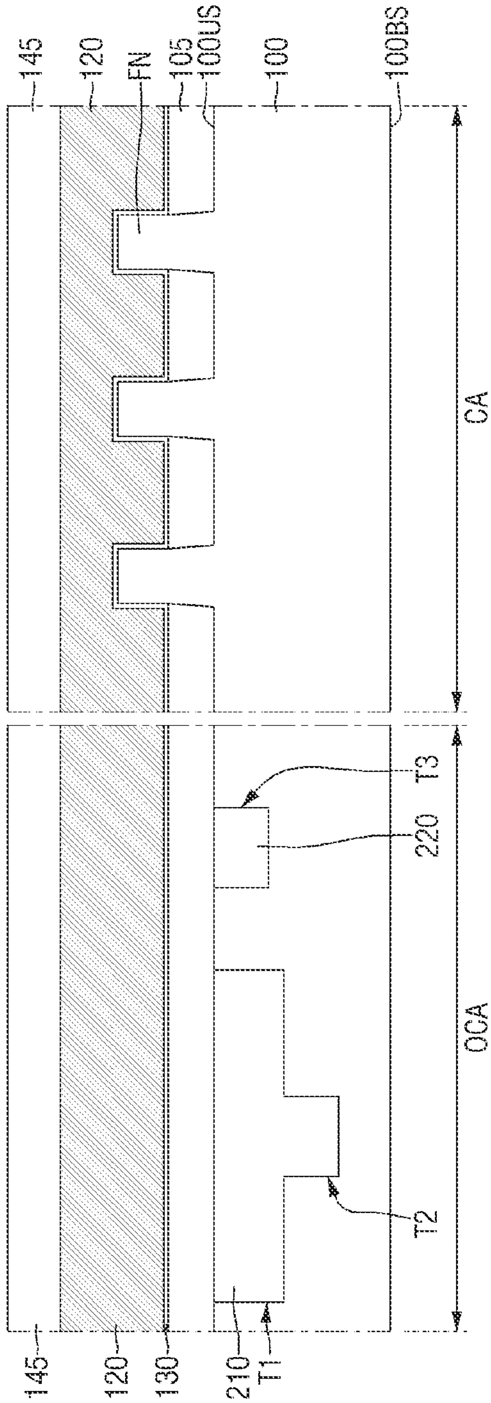

Referring to FIG. 19, a gate insulating film 130, a gate electrode 120, and a gate capping film 145 are formed.

Figure 20:
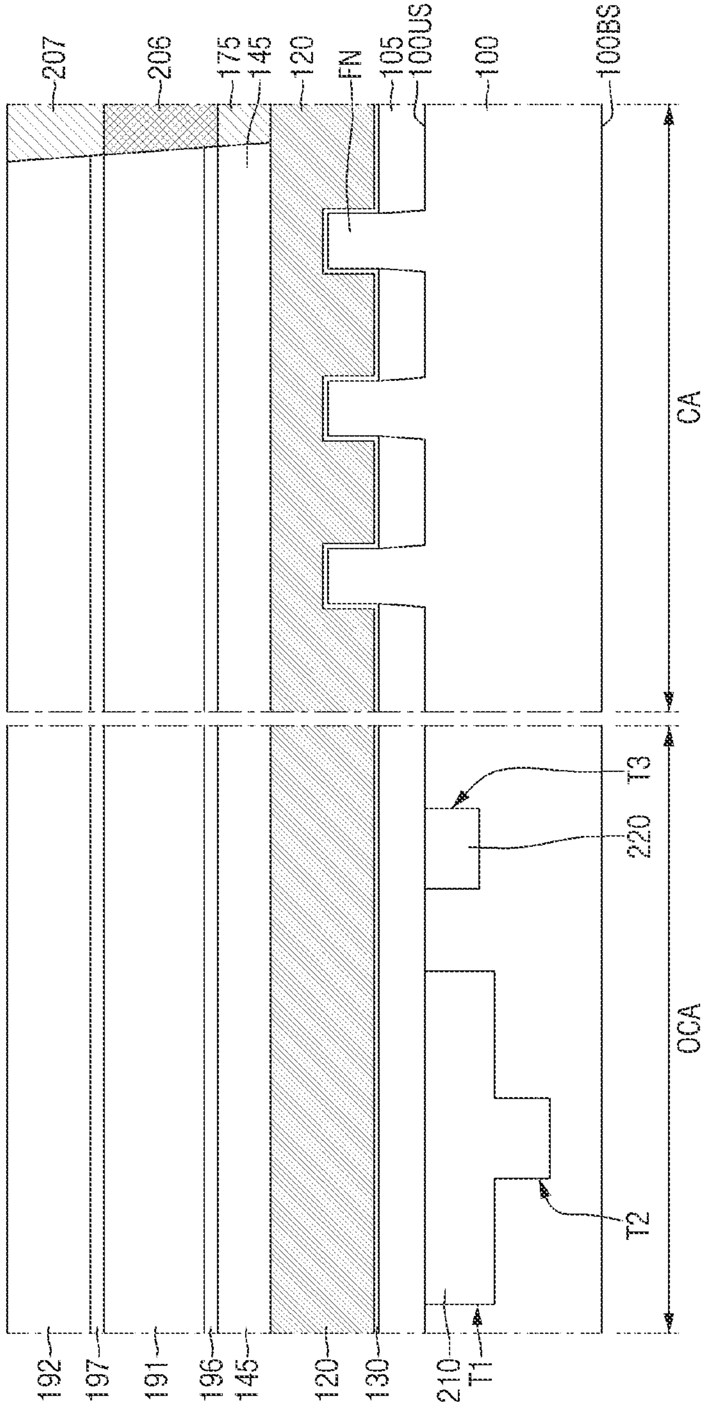

Referring to FIG. 20, a gate contact 175, a frontside wiring via 206, and a frontside wiring line 207 are formed.

The gate contact 175 may be formed on the gate electrode 120. The gate contact 175 may penetrate through the gate capping film 145.

A first etch stop film 196, a second upper interlayer insulating film 191, a second etch stop film 197, and a third upper interlayer insulating film 192 may be formed on the gate capping film 145. The frontside wiring via 206 may penetrate through the first etch stop film 196 and the second upper interlayer insulating film 191. The frontside wiring via 206 may be formed on the gate contact 175. The frontside wiring via 206 may be connected to the gate contact 175. The frontside wiring via 207 may penetrate through the second etch stop film 197 and the third upper interlayer insulating film 192. The frontside wiring line 207 may be connected to the frontside wiring via 206.

Figure 21:
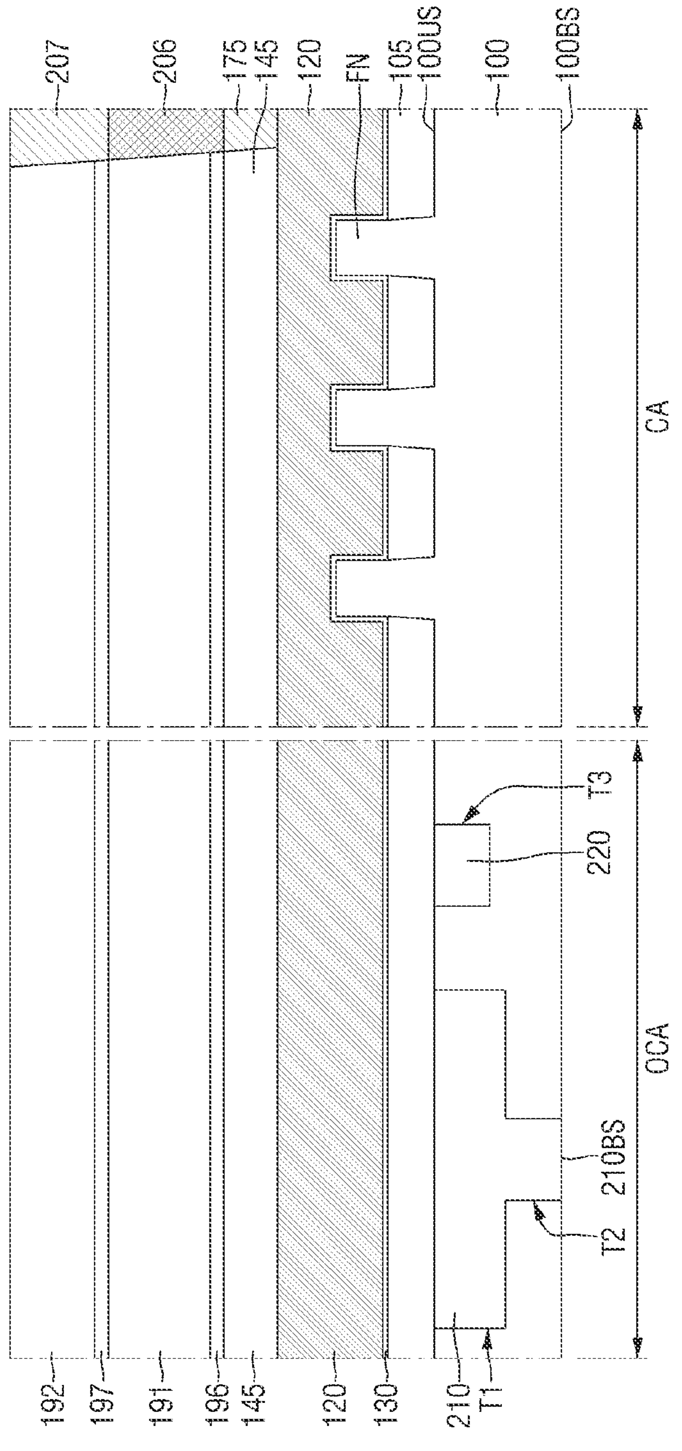

Referring to FIG. 21, a portion of the second surface 100BS of the substrate 100 are removed.

Specifically, a portion of the substrate 100 may be removed from the second surface 100BS of the substrate 100 so that the lower surface 210BS of the first overlay key 210 is exposed. Accordingly, the lower surface 210BS of the first overlay key 210 and the second surface 100BS of the substrate 100 may be disposed on the same plane.

Referring to FIG. 22, a backside contact hole 70H is formed using the mask layer Mask.

The mask layer Mask may be aligned using the first overlay key 210. The mask layer Mask may be aligned on the second surface 100BS of the substrate 100 using the first overlay key 210 exposed on the second surface 100BS of the substrate 100. For example, the mask layer Mask may be aligned so that the mask hole of the mask layer Mask is disposed between the fin patterns FN.

Referring to FIGS. 23 and 24, a backside contact 70 and a backside wiring line 50 are formed.

The backside contact 70 may fill the backside contact hole (70H in FIG. 22). The backside contact 70 may penetrate through the substrate 100. The backside contact 70 may be connected to the source/drain pattern. The backside contact 70 may be connected to a contact connection via 180. A width of the backside contact 70 may decrease as the backside contact 70 approaches the first surface 100US from the second surface 100BS of the substrate 100.

The contact connection via 180 may extend between the frontside wiring via 206 and the backside contact 70. The contact connection via 180 may be connected to the source/drain contact 170 through the frontside wiring via 206. The contact connection via 180 may connect the source/drain contact 170 and the backside contact 70 to each other. The contact connection via 180 may extend between the source/drain contact 170, the source/drain pattern 150, and the fin pattern FN.

The backside wiring line 50 may be formed on the second surface 100BS of the substrate 100. The backside wiring line 50 may be connected to the backside contact 70. The backside wiring line 50 may cover an upper surface of the backside contact 70. The backside wiring line 50 may be formed in the lower interlayer insulating film 290. The lower interlayer insulating film 290 may cover the second surface 100BS of the substrate 100.

Figure 25:
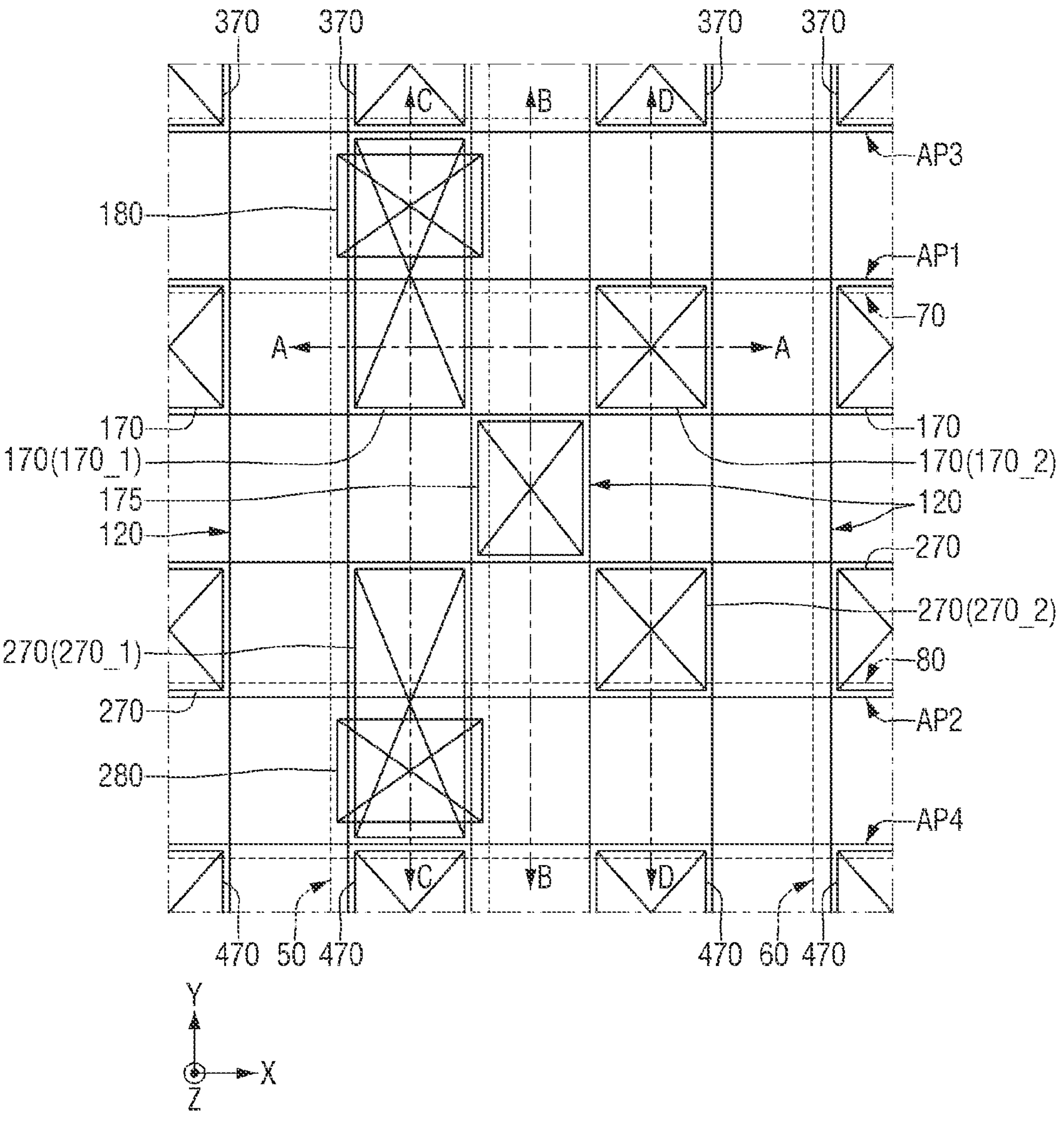
FIG. 25 is a layout view for describing an example of a semiconductor device.
Figure 26:
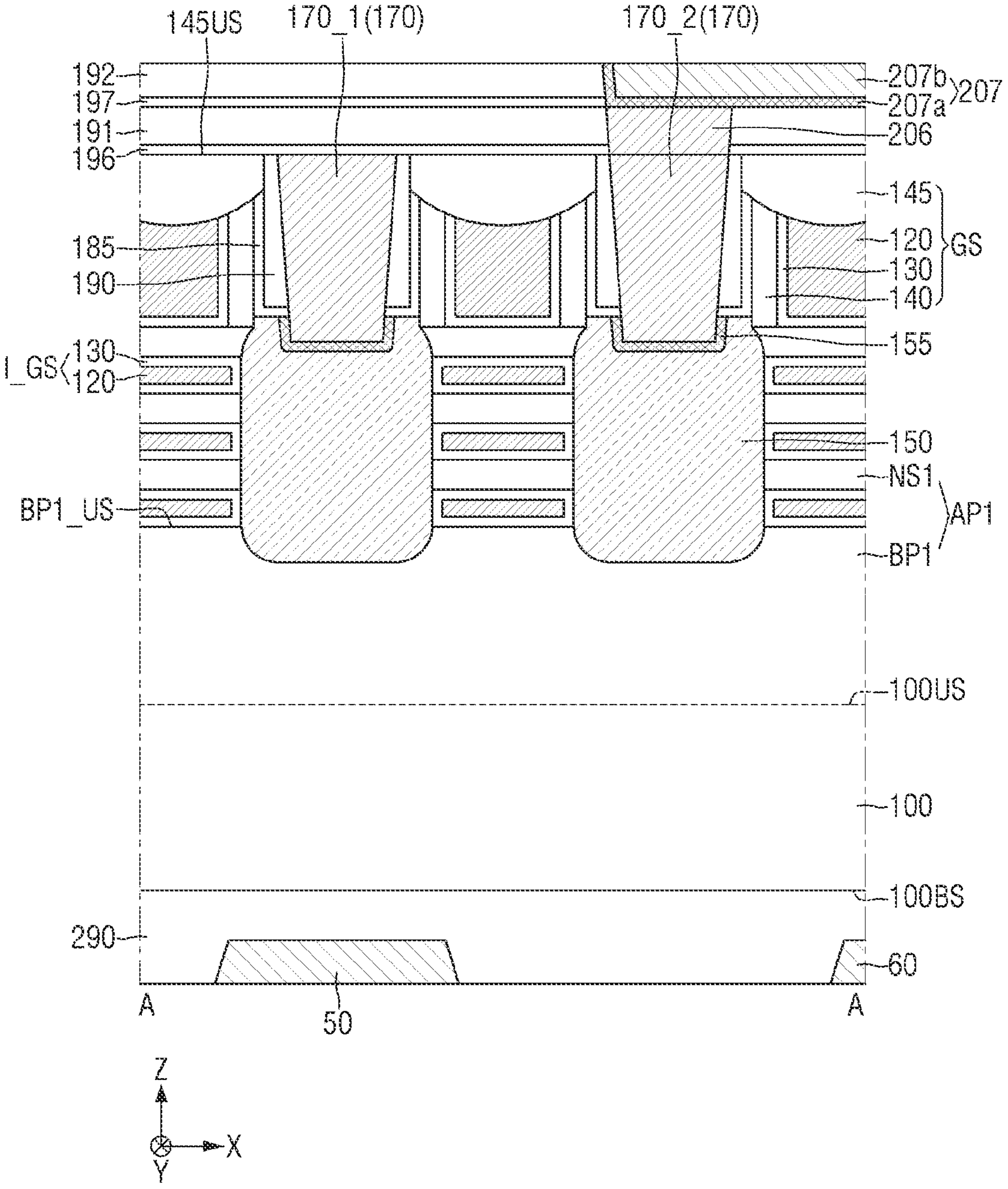
FIG. 26 is an example cross-sectional view taken along line A-A of FIG. 25.
Figure 27:
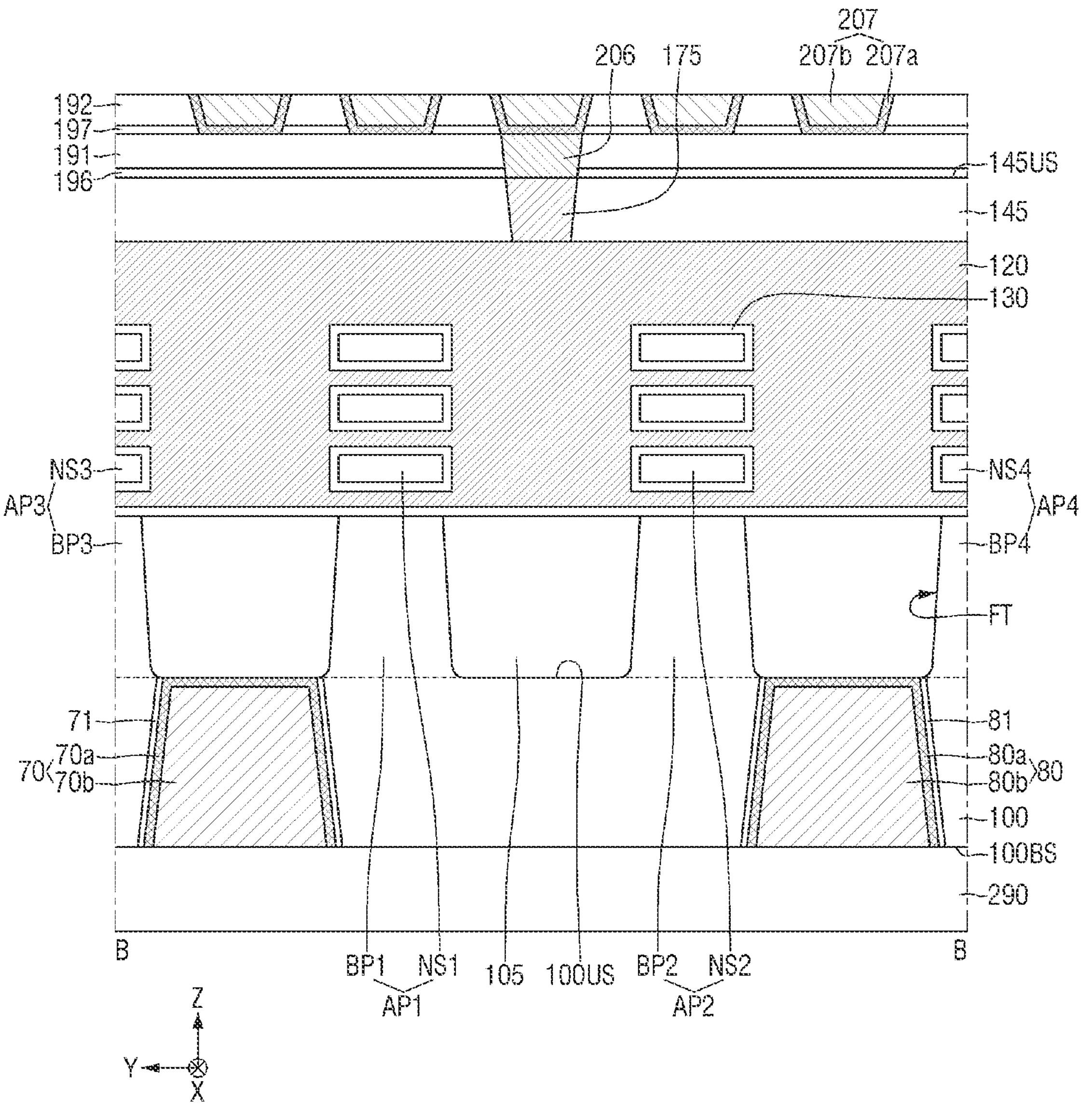
FIG. 27 is an example cross-sectional view taken along line B-B of FIG. 25.
Figure 28:
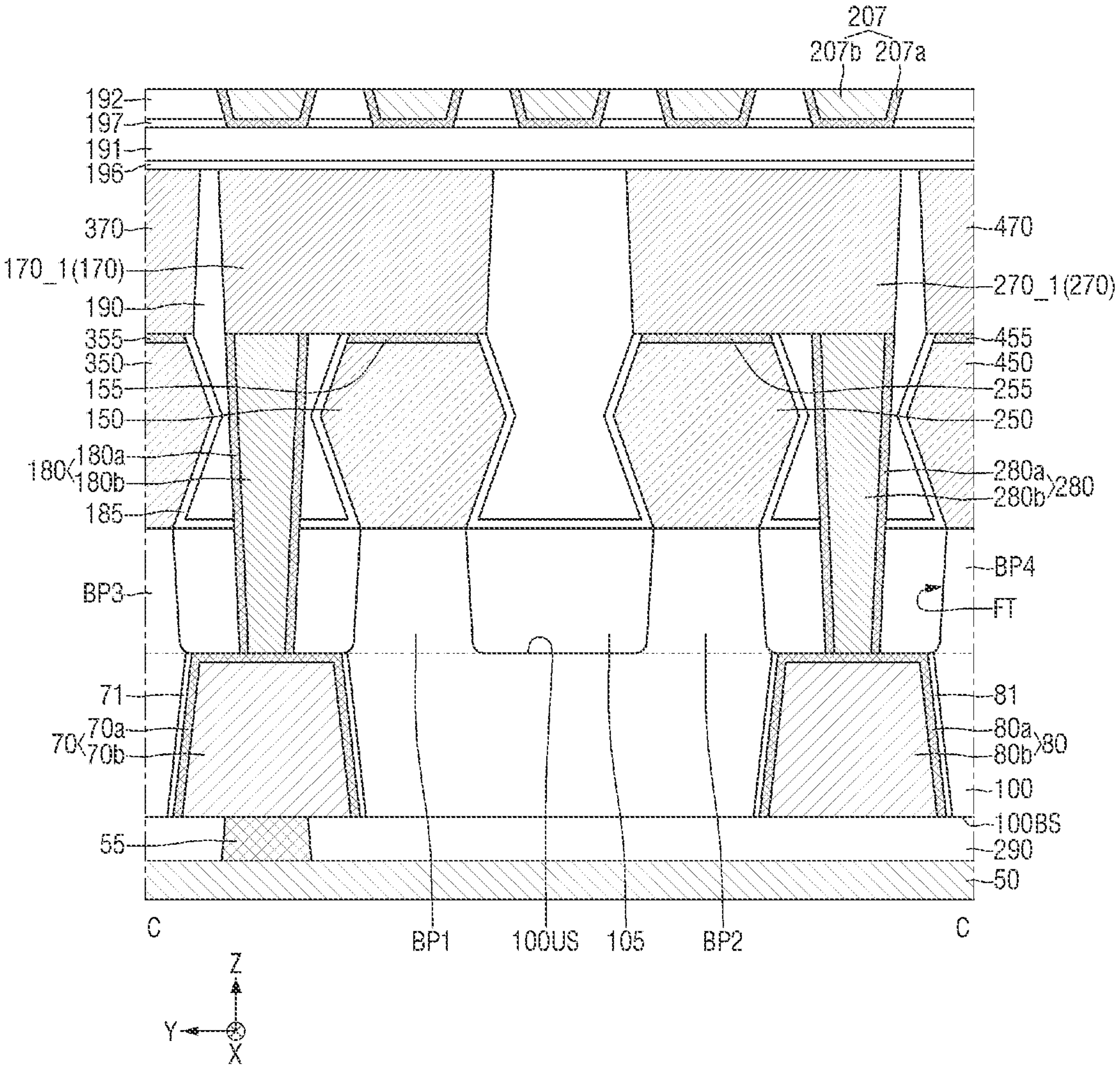
FIG. 28 is an example cross-sectional view taken along line C-C of FIG. 25.
Figure 29:
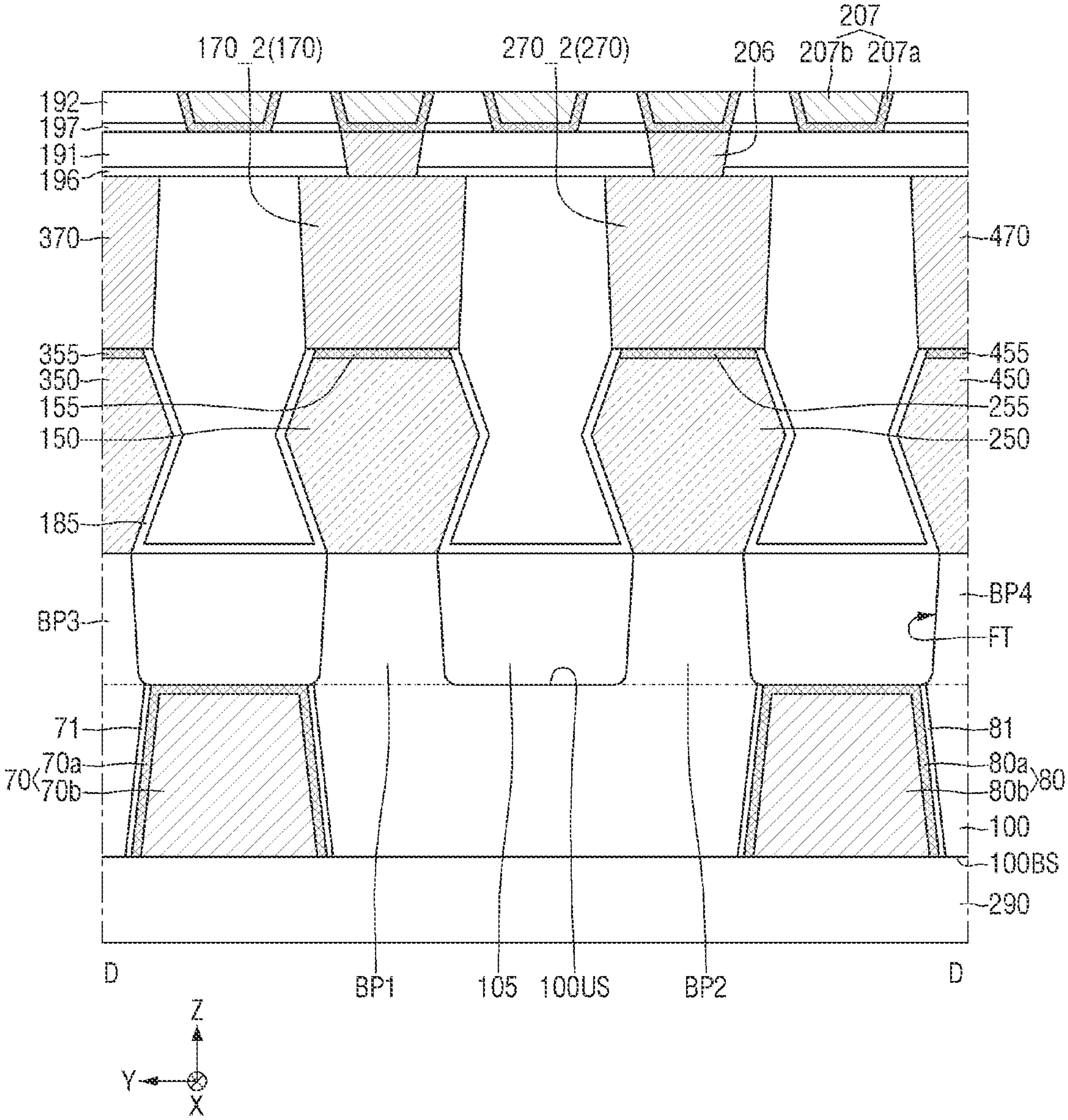
FIG. 29 is an example cross-sectional view taken along line D-D of FIG. 25.

FIG. 25 is a layout view for describing an example of a semiconductor device. FIG. 26 is an example cross-sectional view taken along line A-A of FIG. 25. FIG. 27 is an example cross-sectional view taken along line B-B of FIG. 25. FIG. 28 is an example cross-sectional view taken along line C-C of FIG. 25. FIG. 29 is an example cross-sectional view taken along line D-D of FIG. 25.

Referring to FIGS. 25 to 29, a semiconductor device according to some exemplary implementations includes a substrate 100, a first active pattern AP1, a second active pattern AP2, a third active pattern AP3, a fourth active pattern AP4, a first backside wiring line 50, a second backside wiring line 60, a first buried conductive pattern 70, a second buried conductive pattern 80, a plurality of gate electrodes 120, a first source/drain pattern 150, a second source/drain pattern 250, a third source/drain patterns 350, a fourth source/drain patterns 450, a first source/drain contact 170, a second source/drain contact 270, a third source/drain contact 370, a fourth source/drain contact 470, a first contact connection via 180, a second contact connection via 280, and a source/drain etch stop film 185.

The substrate 100 may include a first surface 100US and a second surface 100BS that are opposite to each other in a third direction Z. Since the gate electrode 120 and the source/drain patterns 150, 250, 350, and 450 may be disposed on the first surface 100US of the substrate, the first surface 100US of the substrate may be an upper surface of the substrate 100. The second surface 100BS of the substrate opposite to the first surface 100US of the substrate may be a lower surface of the substrate 100.

The substrate 100 may be made of a semiconductor material or may include a semiconductor material. The substrate 100 may be a silicon substrate or a silicon-on-insulator (SOI) substrate. Unlike this, the substrate 100 may, for example, include silicon germanium, silicon germanium on insulator (SGOI), indium antimonide, a lead tellurium compound, indium arsenide, indium phosphide, gallium arsenide, or gallium antimonide, but is not limited thereto.

Each of the active patterns AP1, AP2, AP3, and AP4 may be disposed on the substrate 100. For example, each of the active patterns AP1, AP2, AP3, and AP4 may be disposed on the first surface 100US of the substrate. Each of the active patterns AP1, AP2, AP3, and AP4 may extend to be long in the first direction X, respectively.

The first active pattern AP1 may be spaced apart from the second active pattern AP2 and the third active pattern AP3 in the second direction Y. The second active pattern AP2 may be spaced apart from the fourth active pattern AP4 in the second direction Y. For example, the first active pattern AP1 and the second active pattern AP2 may be adjacent to each other in the second direction Y.

As an example, one of the first active pattern AP1 and the second active pattern AP2 may be an area in which a p-type transistor is formed, and the other thereof may be an area in which an n-type transistor is formed. In this case, the first active pattern AP1 and the third active pattern AP3 may be areas in which transistors of the same conductivity type are formed. The second active pattern AP2 and the fourth active pattern AP4 may be areas in which transistors of the same conductivity type are formed.

As another example, the first active pattern AP1 and the second active pattern AP2 may be areas in which a p-type transistor is formed. In this case, the third active pattern AP3 and the fourth active pattern AP4 may be areas in which an n-type transistor is formed.

As still another example, the first active pattern AP1 and the second active pattern AP2 may be areas in which an n-type transistor is formed. The third active pattern AP3 and the fourth active pattern AP4 may be areas in which a p-type transistor is formed.

Each of the active patterns AP1, AP2, AP3, and AP4 may be a multi-channel active pattern. For example, the first active pattern AP1 may include a first lower pattern BP1 and a plurality of first sheet patterns NS1. The second active pattern AP2 may include a second lower pattern BP2 and a plurality of second sheet patterns NS2. The third active pattern AP3 may include a third lower pattern BP3 and a plurality of third sheet patterns NS3. The fourth active pattern AP4 may include a fourth lower pattern BP4 and a plurality of fourth sheet patterns NS4. In the semiconductor device according to some exemplary implementations, each of the active patterns AP1, AP2, AP3, and AP4 may be an active pattern including a nanosheet or a nanowire.

Each of the lower patterns BP1, BP2, BP3, and BP4 may protrude from the substrate 100. For example, each of the lower patterns BP1, BP2, BP3, and BP4 may protrude from the first surface 100US of the substrate. Each of the lower patterns BP1, BP2, BP3, and BP4 may be a fin-type pattern.

Each of the lower patterns BP1, BP2, BP3, and BP4 may extend to be long in the first direction X. The first lower pattern BP1 may be spaced apart from the second lower pattern BP2 and the third lower pattern BP3 in the second direction Y. The second lower pattern BP2 may be spaced apart from the fourth lower pattern BP4 in the second direction Y.

Each of the lower patterns BP1, BP2, BP3, and BP4 may be separated by a fin trench FT extending in the first direction X. For example, the first surface 100US of the substrate may be a bottom surface of the fin trench FT. Each of the lower patterns BP1, BP2, BP3, and BP4 includes a sidewall extending in the first direction X. The sidewall of each of the lower patterns BP1, BP2, BP3, and BP4 may be defined by fin trench FT.

The plurality of first sheet patterns NS1 may be disposed on the first lower pattern BP1. The plurality of first sheet patterns NS1 may be spaced apart from an upper surface BP1_US of the first lower pattern in the third direction Z. The plurality of first sheet patterns NS1 may be disposed on the first surface 100US of the substrate.

The plurality of second sheet patterns NS2 may be disposed on the second lower pattern BP2. The plurality of second sheet patterns NS2 may be spaced apart from the second lower pattern BP2 in the third direction Z. The plurality of third sheet patterns NS3 may be disposed on the third lower pattern BP3. The plurality of third sheet patterns NS3 may be spaced apart from the third lower pattern BP3 in the third direction Z. The plurality of fourth sheet patterns NS4 may be disposed on the fourth lower pattern BP4. The plurality of fourth sheet patterns NS4 may be spaced apart from the fourth lower pattern BP4 in the third direction Z. The second to fourth sheet patterns NS2, NS3, and NS4 may be disposed on the first surface 100US of the substrate.

Here, the first direction X may intersect the second direction Y and a third direction Z. In addition, the second direction Y may intersect the third direction Z. The third direction Z may be a thickness direction of the substrate 100.

Each of the sheet patterns NS1, NS2, NS3, and NS4 may include upper and lower surfaces opposite to each other in the third direction Z. Each of the lower surfaces of the sheet patterns NS1, NS2, NS3, and NS4 may face the substrate 100. Although it is illustrated that three sheet patterns NS1, NS2, NS3, and NS4 are disposed in the third direction Z, respectively, this is only for convenience of explanation, and the present disclosure is not limited thereto.

Each of the sheet patterns NS1, NS2, NS3, and NS4 may include an uppermost sheet pattern farthest from the substrate 100. For example, upper surfaces of the active patterns AP1, AP2, AP3, and AP4 may be upper surfaces of the uppermost sheet patterns among the sheet patterns NS1, NS2, NS3, and NS4.

Each of the lower patterns BP1, BP2, BP3, and BP4 may be formed by etching a portion of the substrate 100 or may include an epitaxial layer grown from the substrate 100. Each of the lower patterns BP1, BP2, BP3, and BP4 may include silicon or germanium, which is an elemental semiconductor material. In addition, each of the lower patterns BP1, BP2, BP3, and BP4 may include a compound semiconductor, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element.

The III-V compound semiconductor may be, for example, one of a binary compound, a ternary compound, or a quaternary compound formed by combining at least one of aluminum (Al), gallium (Ga), and indium (In), which are group III elements, and one of phosphorus (P), arsenic (As), and antimony (Sb), which are group V elements.

Each of the sheet patterns NS1, NS2, NS3, and NS4 may include one of silicon or germanium, which is an elemental semiconductor material, a group IV-IV compound semiconductor, or a group III-V compound semiconductor. The first sheet pattern NS1 will be described as an example. A width of the first sheet pattern NS1 in the second direction Y may increase or decrease in proportion to a width of the first lower pattern BP1 in the second direction Y. Although it is illustrated that the widths of each of the first sheet patterns NS1 disposed on the first lower pattern BP1 in the second direction Y are the same, the present disclosure is not limited thereto.

The field insulating film 105 is disposed on the substrate 100. For example, the field insulating film 105 may be disposed on the first surface 100US of the substrate. The field insulating film 105 may fill at least a portion of the fin trench FT separating the lower patterns BP1, BP2, BP3, and BP4.

The field insulating film 105 may be disposed on the substrate 100 between the lower patterns BP1, BP2, BP3, and BP4. For example, the field insulating film 105 may cover entire sidewalls of the lower patterns BP1, BP2, BP3, and BP4. Unlike illustrated, as another example, the field insulating film 105 may cover portions of the sidewalls of the lower patterns BP1, BP2, BP3, and BP4. In this case, portions of the lower patterns BP1, BP2, BP3, and BP4 may more protrude than an upper surface of the field insulating film 105 in the third direction Z.

The field insulating film 105 does not cover the upper surface BP1_US of the first lower pattern. The field insulating film 105 does not cover upper surfaces of the second to fourth lower patterns BP2, BP3, and BP4. Based on the first surface 100US of the substrate, each of the sheet patterns NS1, NS2, NS3, and NS4 is disposed higher than the upper surface of the field insulating film 105.

The field insulating film 105 may include, for example, an oxide film, a nitride film, an oxynitride film, or a combination thereof. Although the field insulating film 105 is illustrated as a single layer, this is merely for convenience of explanation, and the present disclosure is not limited thereto.

The plurality of gate structures GS may be disposed on the first surface 100US of the substrate. Each of the gate structures GS may extend in the second direction Y. The gate structures GS may be disposed to be spaced apart from each other in the first direction X. The gate structures GS may be adjacent to each other in the first direction X.

The gate structure GS may be disposed on each of the active patterns AP1, AP2, AP3, and AP4. For example, the gate structure GS may intersect the first active pattern AP1 and the second active pattern AP2.

The gate structure GS may intersect the first lower pattern BP1 and the second lower pattern BP2. The gate structure GS may surround each of the first sheet patterns NS1. The gate structure GS may surround each of the second sheet patterns NS2.

The gate structure GS may intersect the third lower pattern BP3 and the fourth lower pattern BP4. The gate structure GS may surround each of the third sheet patterns NS3. The gate structure GS may surround each of the fourth sheet patterns NS4. The gate structure GS is illustrated as being disposed across the first to fourth active patterns AP1, AP2, AP3, and AP4, but is not limited thereto.

The gate structure GS may include, for example, a gate electrode 120, a gate insulating film 130, a gate spacer 140, and a gate capping film 145.

The gate structure GS may include a plurality of inner gate structures I_GS disposed between the first sheet patterns NS1 adjacent in the third direction Z and between the first lower pattern BP1 and the first sheet pattern NS1. The inner gate structure I_GS may be disposed between the upper surface BP1_US of the first lower pattern and the lower surface of the first sheet pattern NS1, and the upper surface of the first sheet pattern NS1 and the lower surface of the first sheet pattern NS1 facing each other in the third direction Z.

The number of inner gate structures I_GS may be the same as the number of first sheet patterns NS1. The inner gate structure I_GS is in contact with the upper surface BP1_US of the first lower pattern, the upper surface of the first sheet pattern NS1, and the lower surface of the first sheet pattern NS1. In the semiconductor device according to some exemplary implementations, the inner gate structure I_GS may be in contact with a first source/drain pattern 150 to be described later.

The inner gate structure I_GS includes a gate electrode 120 and a gate insulating film 130 disposed between the first sheet patterns NS1 adjacent to each other and between the first lower pattern BP1 and the first sheet pattern NS1. Although not illustrated, the inner gate structure I_GS may be disposed between the second sheet patterns NS2 adjacent to each other in the third direction Z and between the second lower pattern BP2 and the second sheet pattern NS2. The inner gate structure I_GS may be disposed between the third sheet patterns NS3 adjacent to each other in the third direction Z and between the third lower pattern BP3 and the third sheet pattern NS3. The inner gate structure I_GS may be disposed between the fourth sheet patterns NS4 adjacent to each other in the third direction Z and between the fourth lower pattern BP4 and the fourth sheet pattern NS4.

Hereinafter, the first active pattern AP1 and the gate structure GS, and the second active pattern AP2 and the gate structure GS will be mainly described.

The gate electrode 120 may be disposed on the first lower pattern BP1 and the second lower pattern BP2. The gate electrode 120 may intersect the first lower pattern BP1 and the second lower pattern BP2. The gate electrode 120 may surround the first sheet pattern NS1 and the second sheet pattern NS2.

In the cross-section view as illustrated in FIG. 26, an upper surface of the gate electrode 120 is illustrated as a concave curved surface, but is not limited thereto. The upper surface of the gate electrode 120 may also be flat.

The gate electrode 120 may include at least one of a metal, a metal alloy, conductive metal nitride, metal silicide, a doped semiconductor material, conductive metal oxide, and conductive metal oxynitride. The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but is not limited thereto. The conductive metal oxide and the conductive metal oxynitride may include an oxidized form of the above-described materials, but are not limited thereto.

The gate insulating film 130 may extend along the upper surface of the field insulating film 105, the upper surface BP1_US of the first upper pattern, and the upper surface of the second lower pattern BP2. The gate insulating film 130 may surround the plurality of first sheet patterns NS1. The gate insulating film 130 may surround the plurality of second sheet patterns NS2. The gate insulating film 130 may be disposed along a circumference of the first sheet pattern NS1 and a circumference of the second sheet pattern NS2. The gate electrode 120 is disposed on the gate insulating film 130.

The gate insulating film 130 is disposed between the gate electrode 120 and the first sheet pattern NS1 and between the gate electrode 120 and the second sheet pattern NS2. In the semiconductor device according to some exemplary implementations, the gate insulating film 130 included in the inner gate structure I_GS may be in contact with a first source/drain pattern 150 to be described later.

The gate insulating film 130 may include silicon oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the gate insulating film 130 is illustrated as a single film, this is merely for convenience of explanation, and the present disclosure is not limited thereto. The gate insulating film 130 may include a plurality of films. The gate insulating film 130 may also include an interfacial layer and a high-k insulating film disposed between the first active pattern AP1 and the gate electrode 120 and between the second active pattern AP2 and the gate electrode 120. For example, the interface layer may not be formed along a profile of the upper surface of the field insulating film 105.

The semiconductor device according to some exemplary implementations may include a negative capacitance (NC)

FET using a negative capacitor. For example, the gate insulating film 130 may include a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected in series with each other and the capacitance of each capacitor has a positive value, a total capacitance decreases as compared with a capacitance of each individual capacitor. On the other hand, when at least one of the capacitances of two or more capacitors connected in series with each other has a negative value, the total capacitance may be greater than an absolute value of each individual capacitance while having a positive value.

When the ferroelectric material film having the negative capacitance and the paraelectric material film having the positive capacitance are connected in series with each other, a total capacitance value of the ferroelectric material film and the paraelectric material film connected in series with each other may increase. A transistor including the ferroelectric material film may have a subthreshold swing (SS) less than 60 mV/decade at room temperature by using the increase in the total capacitance value.

The ferroelectric material film may have the ferroelectric characteristics. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may also be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may vary depending on a type of ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, a ratio of the dopant may be a ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may contain 1 to 7 at % of gadolinium. When the dopant is zirconium (Zr), the ferroelectric material film may include 50 to 80 at % of zirconium.

The paraelectric material film may have the paraelectric characteristics. The paraelectric material film may include, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include the same material. The ferroelectric material film may have the ferroelectric characteristics, but the paraelectric material film may not have the ferroelectric characteristics. For example, when the ferroelectric material film and the paraelectric material film include the hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may vary for each ferroelectric material, the thickness of the ferroelectric material film may vary depending on the ferroelectric material.

As an example, the gate insulating film 130 may include one ferroelectric material film. As another example, the gate insulating film 130 may include a plurality of ferroelectric material films spaced apart from each other. The gate insulating film 130 may have a stacked film structure in which a plurality of ferroelectric material films and a plurality of paraelectric material films are alternately stacked.

The gate spacer 140 may be disposed on a sidewall of the gate electrode 120. The gate spacer 140 may not be disposed between the first lower pattern BP1 and the first sheet pattern NS1 and between the first sheet patterns NS1 adjacent to each other in the third direction Z.

The gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. The gate spacer 140 is illustrated as a single film, but this is merely for convenience of explanation, and the present disclosure is not limited thereto.

The gate capping film 145 may be disposed on the gate electrode 120. An upper surface 145US of a gate capping film may be the upper surface of the gate structure GS. Unlike illustrated, the gate capping film 145 may be disposed between the gate spacers 140.

The gate capping film 145 may include, for example, at least one of silicon nitride (SiN), silicon oxynitride (SiON), silicon carbonitride (SiCN), silicon oxycarbonitride (SiOCN), and a combination thereof.

The first source/drain pattern 150 may be disposed on the first active pattern AP1. The first source/drain pattern 150 may be disposed on the first lower pattern BP1. The first source/drain pattern 150 may be disposed between the gate electrodes 120 adjacent to each other in the first direction X. The first source/drain pattern 150 may be in contact with the first active pattern AP1. The first source/drain pattern 150 may be in contact with the first sheet pattern NS1. The first source/drain pattern 150 is connected to the first sheet pattern NS1 and the first lower pattern BP1 on the first surface 100US of the substrate.

The second source/drain pattern 250 may be disposed on the second active pattern AP2. The second source/drain pattern 250 may be disposed on the second lower pattern BP2. The second source/drain pattern 250 may be disposed between the gate electrodes 120 adjacent to each other in the first direction X. The second source/drain pattern 250 may be in contact with the second active pattern AP2. Although not illustrated, the second source/drain pattern 250 may be in contact with the second sheet pattern NS2. The second source/drain pattern 250 is connected to the second sheet pattern NS2 and the second lower pattern BP2 on the first surface 100US of the substrate.

The third source/drain pattern 350 may be disposed on the third active pattern AP3. The third source/drain pattern 350 may be disposed on the third lower pattern BP3. Although not illustrated, the third source/drain pattern 350 may be in contact with the third sheet pattern NS3. The fourth source/drain pattern 450 may be disposed on the fourth active pattern AP4. The fourth source/drain pattern 450 may be disposed on the fourth lower pattern BP4. Although not illustrated, the fourth source/drain pattern 450 may be in contact with the fourth sheet pattern NS4.

The source/drain patterns 150, 250, 350, and 450 may include bottom surfaces facing the lower patterns BP1, BP2, BP3, and BP4, and sidewalls extending from the bottom surfaces of the source/drain patterns 150, 250, 350, and 450 in the third direction Z. The sidewalls of the source/drain patterns 150, 250, 350, and 450 may include facet intersections where inclined surfaces meet, but are not limited thereto.

The first source/drain pattern 150 may be included in a source/drain of a transistor using the second sheet pattern NS2 as a channel region. The second source/drain pattern 250 may be included in a source/drain of a transistor using the second sheet pattern NS2 as a channel region. The third source/drain pattern 350 may be included in a source/drain of a transistor using the third sheet pattern NS3 as a channel region. The fourth source/drain pattern 450 may be included in a source/drain of a transistor using the fourth sheet pattern NS4 as a channel region.

Each of the source/drain patterns 150, 250, 350, and 450 may include an epitaxial pattern. Each of the source/drain patterns 150, 250, 350, and 450 may include a semiconductor material.

Some of the source/drain patterns 150, 250, 350, and 450 may include a p-type dopant. The p-type dopant may include at least one of boron (B) and gallium (Ga), but is not limited thereto. The rest of the source/drain patterns 150, 250, 350, and 450 may include an n-type dopant. The n-type dopant may include at least one of phosphorus (P), arsenic (As), antimony (Sb), and bismuth (Bi), but is not limited thereto.

The source/drain etch stop film 185 may extend along an outer sidewall of the gate spacer 140 and the sidewalls of the source/drain patterns 150, 250, 350, and 450. The source/drain etch stop film 185 may extend along the upper surface of the field insulating film 105.

The source/drain etch stop film 185 may not extend along a sidewall of the gate capping film 145. Unlike illustrated, the source/drain etch stop film 185 may also extend along the sidewall of the gate capping film 145.

The source/drain etch stop film 185 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and a combination thereof.

The first upper interlayer insulating film 190 is disposed on the first surface 100US of the substrate. The first upper interlayer insulating film 190 may be disposed on the source/drain patterns 150, 250, 350, and 450.

The first upper interlayer insulating film 190 may not cover the upper surface of the gate capping film 145. The first upper interlayer insulating film 190 may include, for example, at least one of silicon oxide, silicon nitride, silicon oxynitride, and a low-k material. A dielectric constant of the low-k material may have a value smaller than 3.9, which is a dielectric constant of silicon oxide.

The first source/drain contact 170 may extend in the third direction Z on the first surface 100US of the substrate. The first source/drain contact 170 may be disposed on the first source/drain pattern 150. The first source/drain contact 170 is electrically connected to the first source/drain pattern 150.

The first source/drain contact 170 may include a first backside connection contact 170_1 and a first frontside connection contact 170_2. The first backside connection contact 170_1 may be connected to the first buried conductive pattern 70 through the first contact connection via 180. The first frontside connection contact 170_2 is not in contact with the first contact connection via 180 and thus is not connected to the first contact connection via 180.

The second source/drain contact 270 may extend in the third direction Z on the first surface 100US of the substrate. The second source/drain contact 270 may be disposed on the second source/drain pattern 250. The second source/drain contact 270 is electrically connected to the second source/drain pattern 250.

The second source/drain contact 270 may include a second backside connection contact 270_1 and a second frontside connection contact 270_2. The second backside connection contact 270_1 may be connected to the second buried conductive pattern 80 through the second contact connection via 280. The second frontside connection contact 270_2 is not in contact with the second contact connection via 280 and thus is not connected to the second contact connection via 280.

The third source/drain contact 370 may extend in the third direction Z on the first surface 100US of the substrate. The third source/drain contact 370 may be disposed on the third source/drain pattern 350. The third source/drain contact 370 is electrically connected to the third source/drain pattern 350. The fourth source/drain contact 470 may extend in the third direction Z on the first surface 100US of the substrate. The fourth source/drain contact 470 may be disposed on the fourth source/drain pattern 450. The fourth source/drain contact 470 is electrically connected to the fourth source/drain pattern 450. Although not illustrated, the third and fourth source/drain contacts 370 and 470 may include a backside connection contact and a frontside connection contact.

For example, in FIG. 28, the first backside connection contact 170_1 and the second backside connection contact 270_1 are arranged in the second direction Y. For example, the first backside connection contact 170_1 may be directly adjacent to the second backside connection contact 270_1 in the second direction Y. In FIG. 29, the first frontside connection contact 170_2 is directly adjacent to the second frontside connection contact 270_2 in the second direction Y.

Based on the upper surface of the field insulating film 105, a height of the upper surface of the first source/drain contact 170 may be the same as that of the upper surface of the second source/drain contact 270. Based on the upper surface of the field insulating film 105, the height of the upper surface of the first source/drain contact 170 may be the same as a height of the upper surface of the third source/drain contact 370 and a height of the upper surface of the fourth source/drain contact 470.

The following description may be made using the first source/drain contact 170 and the second source/drain contact 270. The descriptions of the first source/drain contact 170 and the second source/drain contact 270 may also be applied to the third source/drain contact 370 and the fourth source/drain contact 470.

A first contact silicide film 155 may be disposed between the first source/drain contact 170 and the first source/drain pattern 150. A second contact silicide film 255 may be disposed between the second source/drain contact 270 and the second source/drain pattern 250. A third contact silicide film 355 may be disposed between the third source/drain contact 370 and the third source/drain pattern 350. A fourth contact silicide film 455 may be disposed between the fourth source/drain contact 470 and the fourth source/drain pattern 450.

The gate contact 175 may be disposed on the gate electrode 120. The gate contact 175 may be connected to the gate electrode 120. The gate contact 175 may connect the frontside wiring via 206 and the gate contact 175 to each other. The gate contact 175 may penetrate through the gate capping film 145.

The frontside wiring via 206 may be disposed on the gate contact 175 and the source/drain contacts 170, 270, 370, and 470. The frontside wiring via 206 may be directly connected to the gate contact 175 and the source/drain contacts 170, 270, 370, and 470.

The frontside wiring via 206 may be disposed between the source/drain contacts 170, 270, 370, and 470 and the frontside wiring line 207. The frontside wiring via 206 may be disposed between the gate contact 175 and the frontside wiring line 207. The frontside wiring via 206 may connect the source/drain contacts 170, 270, 370, and 470 and the frontside wiring line 207 to each other. The frontside wiring via 206 may connect the gate contact 175 and the frontside wiring line 207 to each other.

The first frontside connection contact 170_2 and the second frontside connection contact 270_2 may be connected to the frontside wiring line 207 through the frontside wiring via 206. In the semiconductor device according to some exemplary implementations, the first backside connection contact 170_1 and the second backside connection contact 270_1 are not be connected to the frontside wiring line 207. The frontside wiring via 206 may not be disposed on the first backside connection contact 170_1 and the second backside connection contact 270_1.

In FIG. 26, a height from the upper surface of the first active pattern AP1 to the upper surface of the first source/drain contact 170 is the same as a height from the upper surface of the first active pattern AP1 to the upper surface 145US of the gate capping pattern, but is not limited thereto. The upper surface of the first source/drain contact 170 may be positioned at a boundary between the frontside wiring via 206 and the first source/drain contact 170.

In addition, based on the second surface 100BS of the substrate, a height of the upper surface of the first source/drain contact 170 in FIG. 26 may be the same as a height of the upper surface of the first source/drain contact 170 in FIGS. 28 and 29, but is not limited thereto.

In the semiconductor device according to some exemplary implementations, the source/drain contacts 170, 270, 370, and 470 and the frontside wiring via 206 have a single film structure. For example, the source/drain contacts 170, 270, 370, and 470 and the frontside wiring via 206 may be formed of a single conductive material. The source/drain contacts 170, 270, 370, and 470 and the frontside wiring via 206 may have a single conductive film structure. In this case, the source/drain contacts 170, 270, 370, and 470 and the frontside wiring via 206 may include impurities unintentionally introduced in a process of forming the source/drain contacts 170, 270, 370, and 470 and the frontside wiring via 206. In addition, the gate contact 175 may have a single film structure.

The source/drain contacts 170, 270, 370, and 470, the frontside wiring via 206, and the gate contact 175 may include, for example, at least one of a metal or a metal alloy. The source/drain contacts 170, 270, 370, and 470, the frontside wiring via 206, and the gate contact 175 may include, for example, at least one of tungsten (W), molybdenum (Mo), ruthenium (Ru), and ruthenium-aluminum (RuAl), but the technical idea of the present disclosure is not limited thereto.

The contact silicide films 155, 255, 355, and 455 may include a metal silicide material.

The first buried conductive pattern 70 may be disposed between the first active pattern AP1 and the third active pattern AP3. The first buried conductive pattern 70 may overlap the field insulating film 105 disposed between the first lower pattern BP1 and the third lower pattern BP3 in the third direction Z.

The second buried conductive pattern 80 may be disposed between the second active pattern AP2 and the fourth active pattern AP4. The second buried conductive pattern 80 may overlap the field insulating film 105 disposed between the second lower pattern BP2 and the fourth lower pattern BP4 in the third direction Z.

The first buried conductive pattern 70 and the second buried conductive pattern 80 may each extend to be long in the first direction X. In plan view, at least a portion of the gate electrode 120 may intersect the first buried conductive pattern 70 and the second buried conductive pattern 80. In the semiconductor device according to some exemplary implementations, the first buried conductive pattern 70 and the second buried conductive pattern 80 may be each formed in a line shape.

The first buried conductive pattern 70 and the second buried conductive pattern 80 may correspond to the backside contact 70 described with reference to FIGS. 1 to 24.

The first buried conductive pattern 70 may be connected to the first backside connection contact 170_1 through the first contact connection via 180. The first buried conductive pattern 70 may be connected to the first backside wiring line 50.

The second buried conductive pattern 80 may be connected to the second backside connection contact 270_1 through the second contact connection via 280. Although not illustrated, the second buried conductive pattern 80 may be connected to the second backside wiring line 60.

The first buried conductive pattern 70 and the second buried conductive pattern 80 may penetrate through the substrate 100. The first buried conductive pattern 70 and the second buried conductive pattern 80 may extend from the second surface 100BS of the substrate to the first surface 100US of the substrate. As an example, the first buried conductive pattern 70 and the second buried conductive pattern 80 may not more protrude than the first surface 100US of the substrate in the third direction Z. Unlike illustrated, a portion of the first buried conductive pattern 70 and a portion of the second buried conductive pattern 80 may more protrude than the first surface 100US of the substrate in the third direction Z and be disposed within the field insulating film 105.

A first buried insulating liner 71 may extend along a sidewall of the first buried conductive pattern 70. The first buried insulating liner 71 may be disposed between the first buried conductive pattern 70 and the substrate 100. A second buried insulating liner 81 may extend along a sidewall of the second buried conductive pattern 80. The second buried insulating liner 81 may be disposed between the second buried conductive pattern 80 and the substrate 100. Unlike illustrated, the buried insulating liners 71 and 81 may not be formed between the buried conductive patterns 70 and 80 and the substrate 100.

The first buried conductive pattern 70 may include a first buried conductive barrier film 70*a* and a first buried conductive plug 70*b*. The second buried conductive pattern 80 may include a second buried conductive barrier film 80*a* and a second buried conductive plug 80*b*.

The first buried conductive barrier film 70*a* and the second buried conductive barrier film 80*a* may include, for example, at least one of a metal, conductive metal nitride, conductive metal carbide, conductive metal oxide, conductive metal carbonitride, and a two-dimensional (2D) material. The first buried conductive plug 70*b* and the second buried conductive plug 80*b* may include at least one of a metal and a metal alloy. The first buried insulating liner 71 and the second buried insulating liner 81 may include an insulating material. Unlike illustrated, the first buried conductive pattern 70 and the second buried conductive pattern 80 may have a single conductive film structure.

The 2D material may include a two-dimensional allotrope or a two-dimensional compound, and may include, for example, at least one of, for example, graphene, boron nitride (BN), molybdenum sulfide, molybdenum selenide, tungsten sulfide, tungsten selenide, and tantalum sulfide, but is not limited thereto. That is, since the above-described 2D material is only listed as an example, the 2D material that may be included in the semiconductor device of the present disclosure is not limited by the above-described material.

The first contact connection via 180 may be disposed between the first source/drain contact 170 and the first buried conductive pattern 70. For example, the first contact connection via 180 connects the first backside connection contact 170_1 and the first buried conductive pattern 70 to each other. The first contact connection via 180 may be directly connected to the first backside connection contact 170_1. For example, the first contact connection via 180 may penetrate through the source/drain etch stop film 185 and the field insulating film 105 and be connected to the first buried conductive pattern 70.

The first contact connection via 180 may be disposed between the first source/drain contact 170 and the first buried conductive pattern 70. For example, the first contact connection via 180 connects the first backside connection contact 170_1 and the first buried conductive pattern 70 to each other. The first contact connection via 180 may be directly connected to the first backside connection contact 170_1. For example, the first contact connection via 180 may penetrate through the source/drain etch stop film 185 and the field insulating film 105 and be connected to the first buried conductive pattern 70.

The second contact connection via 280 may be disposed between the second source/drain contact 270 and the second buried conductive pattern 80. For example, the second contact connection via 280 connects the second backside connection contact 270_1 and the second buried conductive pattern 80 to each other. The second contact connection via 280 may be directly connected to the second backside connection contact 270_1. For example, the second contact connection via 280 may penetrate through the source/drain etch stop film 185 and the field insulating film 105 and be connected to the second buried conductive pattern 80.

A width of the first contact connection via 180 in the second direction Y may increase as a distance from the second surface 100BS of the substrate increases. A width of the second contact connection via 380 in the second direction Y may increase as a distance from the second surface 100BS of the substrate increases.

The first contact connection via 180 and the second contact connection via 280 may have a multilayer structure. That is, the first contact connection via 180 and the second contact connection via 280 may have a multi-conductive film structure. The first contact connection via 180 may include a first contact connection barrier film 180*a* and a first contact connection plug 180*b*. The second contact connection via 280 may include a second contact connection barrier film 280*a* and a second contact connection plug 280*b*.

The first contact connection barrier film 180*a* extends along a sidewall of the first contact connection plug 180*b*. The second contact connection barrier film 280*a* extends along a sidewall of the second contact connection plug 280*b*.

The first contact connection plug 180*b* may be directly connected to the first backside connection contact 170_1. The first contact connection plug 180*b* may include an upper surface facing the first backside connection contact 170_1. The upper surface of the first contact connection plug 180*b* is in contact with the first backside connection contact 170_1. The second contact connection plug 280*b* may be directly connected to the second backside connection contact 270_1. The second contact connection plug 280*b* may include an upper surface facing the second backside connection contact 270_1. The upper surface of the second contact connection plug 280*b* is in contact with the second backside connection contact 270_1.

The first contact connection barrier film 180*a* and the second contact connection barrier film 280*a* may include, for example, at least one of a metal, conductive metal nitride, conductive metal carbide, conductive metal oxide, conductive metal carbonitride, and a two-dimensional (2D) material. The first contact connection plug 180*b* and the second contact connection plug 280*b* may include at least one of a metal and a metal alloy.

As an example, the first contact connection plug 180*b* may include the same material as the first backside connection contact 170_1. The second contact connection plug 280*b* may include the same material as the second backside connection contact 270_1. In this case, a boundary between the contact connection plug 180*b* and 280*b* and the backside connection contacts 170_1 and 270_1 may not be distinguished.

As another example, the first contact connection plug 180*b* may include a material different from that of the first backside connection contact 170_1. The second contact connection plug 280*b* may include a material different from that of the second backside connection contact 270_1.

Unlike illustrated, the first contact connection via 180 and the second contact connection via 280 may have a single conductive film structure.

The first backside wiring line 50 and the second backside wiring line 60 may be disposed on the second surface 100BS of the substrate. For example, each of the first backside wiring line 50 and the second backside wiring line 60 may extend in the second direction Y, but is not limited thereto. The first backside wiring line 50 and the second backside wiring line 60 may correspond to the backside wiring lines described with reference to FIGS. 1 to 24.

The first backside wiring line 50 may be connected to the first buried conductive pattern 70. The first backside wiring line 50 may be connected to the first backside connection contact 170_1 through the first buried conductive pattern 70. The first backside connection contact 170_1 connects the first backside wiring line 50 and the first source/drain pattern 150 to each other. The first frontside connection contact 170_2 is not connected to the first backside wiring line 50.

Although not illustrated, the second backside wiring line 60 may be connected to the second buried conductive pattern 80. The second backside wiring line 60 may be connected to the second backside connection contact 270_1 through the second buried conductive pattern 80. The second backside connection contact 270_1 connects the second backside wiring line 60 and the second source/drain pattern 250 to each other. The second frontside connection contact 270_2 is not connected to the second backside wiring line 60.

As an example, the first backside wiring line 50 and the second backside wiring line 60 may be power lines that supply power to the semiconductor device. As another example, the first backside wiring line 50 and the second backside wiring line 60 may be signal lines that supply operation signals of the semiconductor device. As still another example, one of the first backside wiring line 50 and the second backside wiring line 60 may be a power line, and the other thereof may be a signal line.

A first backside wiring via 55 may be disposed between the first backside wiring line 50 and the first buried conductive pattern 70. The first backside wiring via 55 connects the first backside wiring line 50 and the first buried conductive pattern 70 to each other. Although not illustrated, a second backside wiring via may be disposed between the second backside wiring line 60 and the second buried conductive pattern 80. The second backside wiring via connects the second backside wiring line 60 and the second buried conductive pattern 80 to each other.

The first backside wiring line 50 and the second backside wiring line 60 are illustrated as having a single conductive film structure, but are not limited thereto. Unlike illustrated, the first backside wiring line 50 and the second backside wiring line 60 may have a multi-conductive film structure including a backside wiring barrier film and a backside wiring plug film, like the frontside wiring line 207. The first backside wiring via 55 is illustrated as having a single conductive film structure, but is not limited thereto.

The first backside wiring line 50, the second backside wiring line 60, and the first backside wiring via 55 may include, for example, at least one of a metal, a metal alloy, conductive metal nitride, conductive metal carbide, conductive metal oxide, conductive metal carbonitride, and a two-dimensional (2D) material. A boundary between the first backside wiring line 50 and the first backside wiring via 55 is illustrated as being distinguished, but is not limited thereto. The first backside wiring line 50 and the first backside wiring via 55 may have an integral structure with no boundary separation.

The lower interlayer insulating film 290 may be disposed on the second surface 100BS of the substrate. The first backside wiring line 50, the first backside wiring via 55, and the second backside wiring line 60 may be disposed within the lower interlayer insulating film 290. The lower interlayer insulating film 290 may include, for example, at least one of silicon oxide, silicon nitride, silicon carbonitride, silicon oxynitride, and a low-k material.

The first etch stop film 196 and the second upper interlayer insulating film 191 may be disposed on the first upper interlayer insulating film 190. The second upper interlayer insulating film 191 may cover a sidewall of the frontside wiring via 206.

The second etch stop film 197 and the third upper interlayer insulating film 192 may be sequentially disposed on the second upper interlayer insulating film 191. The second etch stop film 197 may be disposed between the second upper interlayer insulating film 191 and third upper interlayer insulating film 192.

The first etch stop film 196 and the second etch stop film 197 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and a combination thereof. The third upper interlayer insulating film 192 may include, for example, at least one of silicon oxide, silicon nitride, silicon carbonitride, silicon oxynitride, and a low-k material.

The frontside wiring line 207 may be disposed within the third upper interlayer insulating film 192. The frontside wiring line 207 may be disposed on the first surface 100US of the substrate.

The frontside wiring via 207 may be connected to the source/drain contacts 170, 270, 370, and 470 and the gate contact 175. The frontside wiring line 207 may be connected to the source/drain contacts 170, 270, 370, and 470 through the frontside wiring via 206. The frontside wiring line 207 may connect the gate contact 175 through the frontside wiring via 206.

The frontside wiring line 207 may include a frontside wiring barrier film 207*a* and a frontside wiring plug 207*b*. The frontside wiring barrier film 207*a* may include, for example, at least one of a metal, conductive metal nitride, conductive metal carbide, conductive oxide, conductive metal carbonitride, and a two-dimensional (2D) material. The frontside wiring plug 207*b* may include, for example, at least one of a metal and a metal alloy. The frontside wiring line 207 is illustrated as having a multi-conductive film structure, but is not limited thereto. Unlike illustrated, the frontside wiring line 207 may have a single conductive film structure like the backside wiring lines 50 and 60.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

In concluding the detailed description, those skilled in the art will appreciate that many variations and modifications may be made to the implementations without substantially departing from the principle and scope of the following claims. Therefore, the implementations are used in a generic and descriptive sense only and not for purposes of limitation.

What is claimed is:

1. A semiconductor device fabricating method comprising:

forming a substrate including a chip area and an outside chip area, the substrate having a first surface and a second surface opposite to the first surface;

forming a first trench having a first width on the first surface, the first trench in the outside chip area of the substrate;

forming a second trench having a second width smaller than the first width, the second trench within the first trench;

forming a first overlay key filling the first trench and the second trench;

forming an active pattern on the first surface of the substrate;

forming a source/drain pattern and a gate electrode on the active pattern in the chip area; and forming a backside contact on the second surface using a bottom surface of the first overlay key in the second trench.

2. The semiconductor device fabricating method of claim 1, wherein a width of the backside contact decreases as the backside contact approaches the first surface from the second surface.

3. The semiconductor device fabricating method of claim 1, wherein a bottom surface of the second trench is spaced apart from the second surface.

4. The semiconductor device fabricating method of claim 1, further comprising removing a portion of the substrate on the second surface such that the bottom surface of the first overlay key in the second trench is exposed.

5. The semiconductor device fabricating method of claim 1, wherein forming the active pattern on the first surface further includes forming a plurality of sheet patterns extending along a profile of the first trench and the first surface of the substrate after forming the first trench.

6. The semiconductor device fabricating method of claim 5, wherein the second trench penetrates through the plurality of sheet patterns in the first trench.

7. The semiconductor device fabricating method of claim 1, wherein forming of the backside contact includes:

aligning a mask layer on the second surface of the substrate using the first overlay key;

forming a contact hole on the second surface of the substrate using the mask layer; and forming the backside contact in the contact hole.

8. The semiconductor device fabricating method of claim 1, wherein a bottom surface of the second trench is disposed below a bottom surface of the first trench with respect to the second surface of the substrate.

9. The semiconductor device fabricating method of claim 1, further comprising forming a third trench on the first surface of the substrate in the outside chip area.

10. The semiconductor device fabricating method of claim 9, wherein a width of the third trench is same as the second width.

11. The semiconductor device fabricating method of claim 1, wherein a top surface of the first overlay key is disposed on a same plane as a top surface of the source/drain pattern.

12. A semiconductor device fabricating method comprising:

forming a substrate including a chip area and an outside chip area, the substrate having a first surface and a second surface opposite to the first surface;

forming a first overlay key including a first portion having a first width and a second portion disposed below the first portion and having a second width smaller than the first width in the outside chip area;

forming an active pattern on the first surface of the substrate;

forming a source/drain pattern and a gate electrode on the active pattern in the chip area;

forming a backside contact penetrating through the substrate on the second surface using the first overlay key; and forming a backside wiring line connected to the backside contact.

13. The semiconductor device fabricating method of claim 12, wherein forming the first overlay key includes:

forming a first trench on the first surface of the substrate in the outside chip area;

forming a second trench having a smaller width than the first trench on a bottom surface of the first trench; and forming an oxide film filling the first trench and the second trench.

14. The semiconductor device fabricating method of claim 12, wherein the backside contact is connected to the source/drain pattern.

15. The semiconductor device fabricating method of claim 12, wherein the active pattern includes a fin pattern, and a top surface of the first portion of the first overlay key is disposed on a same plane as the first surface of the substrate.

16. The semiconductor device fabricating method of claim 15, wherein forming the first overlay key includes:

forming a first trench having a third width on the first surface of the substrate in the outside chip area;

forming a second trench having a fourth width smaller than the third width on a bottom surface of the first trench;

forming the second portion in the second trench; and forming the first portion in the first trench, wherein the first width and the third width are same, and the second width and the fourth width are same.

17. The semiconductor device fabricating method of claim 12, wherein the active pattern includes a plurality of sheet patterns, the plurality of sheet patterns extend along a side surface and a bottom surface of the first portion of the first overlay key, and the second portion of the first overlay key penetrates through the plurality of sheet patterns.

18. The semiconductor device fabricating method of claim 17, wherein forming the first overlay key includes:

forming a first trench having a third width on the first surface of the substrate in the outside chip area; and forming a second trench having a fourth width smaller than the third width on a bottom surface of the first trench, wherein the forming of the active pattern includes:

forming the plurality of sheet patterns extending along the bottom surface and inner surfaces of the first trench in the outside chip area, wherein the first width is smaller than the third width, the second width and the fourth width are same, and with respect to the second surface, the bottom surface of the first portion is disposed above the bottom surface of the first trench.

19. The semiconductor device fabricating method of claim 12, further comprising forming a second overlay key separated from the first overlay key and penetrating through the first surface of the substrate in the outside chip area.

20. A semiconductor device fabricating method comprising:

forming a substrate including a chip area and an outside chip area, the substrate having a first surface and a second surface opposite to the first surface;

forming a first trench having a first width on the first surface, the first trench in the outside chip area of the substrate;

forming a plurality of sheet patterns extending along the first trench and the first surface in the outside chip area and the chip area;

forming a second trench penetrating through the plurality of sheet patterns in the first trench and the substrate and having a second width smaller than the first width in the outside chip area;

forming a third trench penetrating through the plurality of sheet patterns on the first surface and separated from the first trench in the outside chip area;

forming a first overlay key filling the first trench and the second trench;

forming a second overlay key filling the third trench, forming a source/drain pattern and a gate electrode on the plurality of sheet patterns in the chip area;

forming a source/drain contact on the source/drain pattern;

forming a gate contact on the gate electrode;

removing a portion of the substrate on the second surface such that a bottom surface of the first overlay key in the second trench is exposed;

aligning a mask layer on the second surface using the bottom surface of the first overlay key;

forming a contact hole on the second surface of the substrate using the mask layer;

forming a backside contact filling the contact hole; and forming a backside wiring line connected to the backside contact.

* * * * *